United States Patent

Yamada et al.

[11] Patent Number: 5,981,316
[45] Date of Patent: Nov. 9, 1999

[54] METHOD OF FABRICATION OF ATOMIC CHAIN CIRCUIT NETWORK

[75] Inventors: Toshishige Yamada, Mountain View, Calif.; Yoshihiro Takiguchi, Toyko; Dehuan Huang, Ibaraks, both of Japan; Yoshihisa Yamamoto, Stanford, Calif.

[73] Assignees: The Board of Trustees of the Leland Stanford Junior University, Palo Alto, Calif.; Research Development Corporation of Japan, Saitama, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/336,852

[22] Filed: Nov. 8, 1994

[51] Int. Cl.$^6$ ..................................................... H01L 21/70
[52] U.S. Cl. ........................... 438/128; 438/129; 438/962
[58] Field of Search ..................................... 438/128, 129, 438/962; 250/492.2, 492.1; 307/112

[56] References Cited

U.S. PATENT DOCUMENTS

| | | | |
|---|---|---|---|
| 3,988,823 | 11/1976 | Hu | 29/577 |
| 4,122,479 | 10/1978 | Sugawara et al. | 357/19 |
| 4,589,191 | 5/1986 | Green et al. | 29/572 |
| 4,987,312 | 1/1991 | Eigler | 250/492.3 |
| 5,561,300 | 10/1996 | Wada et al. | |

FOREIGN PATENT DOCUMENTS

| | | |
|---|---|---|
| 548905A2 | 6/1993 | European Pat. Off. . |
| 588062A1 | 3/1994 | European Pat. Off. . |

OTHER PUBLICATIONS

Huang et al., "Scanning Tunneling Microscope Fabrication of Atomic–Scale Memory on a Silicon Surface", *Jpn. J. Appl. Phys.* 33:L190–L193 (1994).

Lyding et al., "Nanoscale Patterning and Oxidation of H–passivated Si(100)–2x1 Surfaces with an Ultrahigh Vacuum Scanning Tunneling Microscope", *Appl. Phys. Lett.* 64(15):2010–2012 (1994).

Primary Examiner—Chandra Chaudhari
Assistant Examiner—Keith Christianson
Attorney, Agent, or Firm—Flehr Hohbach Test; Albritton & Herbert LLP

[57] ABSTRACT

An insulated lattice is prepared with a plurality of lattice oriented atoms to create a substantially planar surface having a lattice arrangement. Any unsatisfied chemical bonds are terminated along the substantially planar surface by placing atoms at the site of the unsatisfied chemical bonds to terminate the unsatisfied chemical bonds and insulate the surface to form an insulated lattice platform. Atoms are placed at predetermined locations on the insulated lattice platform to form a first atomic chain which behaves as one of a conductor, a semiconductor and an insulator. A second chain of atoms is also placed at predetermined locations on the insulated lattice platform so that the second chain behaves as another of a conductor, a semiconductor and an insulator. These placements are made such that the second chain of atoms is electrically coupled to the first chain of atoms, and the second chain of atoms behaves differently than the first chain of atoms. That is, in the first chain the atoms are placed at a first separation distance and in the second chain the atoms are placed at a second separation distance, where the second separation distance is different than the first.

15 Claims, 16 Drawing Sheets

METHOD OF FABRICATION OF ATOMIC CHAIN CIRCUIT NETWORK

FIELD OF THE INVENTION

The present invention relates generally to a method of making an atomic chain circuit network. In particular, it relates to a circuit having a single chain of atoms with distinct electrical characteristics related to the atomic spacing between the circuit atoms.

BACKGROUND OF THE INVENTION

In a conventional circuit network based on semiconductor device technology, functional devices made of semiconductors or insulators are connected together by relatively large metal traces designed to carry electrical signals. These structures typically require real estate on the order of tens of square micrometers, and more.

Mesoscopic structures are smaller, but still require significant real estate. To fabricate such a circuit network on a silicon substrate, diodes or transistors based on p-n junctions, or resistors made of doped semiconductors are connected by several ten nanometer wide metal lines deposited on the substrate, power is fed from a battery or an external generator, and a large ground plane is made by deposition of metal on the substrate which may be connected to the main ground. The resulting structure quickly becomes complicated and can typically require real estate on the order of hundreds of square nanometers, and more.

If the circuit network together with device elements is simply scaled down, the physical operation principle for these macroscopic devices undergoes a drastic change even at nanoscale, where the wave nature of the electrons play an important role in device operation. To further miniaturize the structures, a new device principle must be developed, adopting the atomic nature of constituent atoms forming the device.

OBJECTS AND SUMMARY OF THE INVENTION

The present invention provides a method for making an atomic chain circuit. An object of the invention is to provide a circuit that utilizes a minimum amount of real estate. A related object is to position and couple individual atoms on an insulated lattice to form an atomic chain. A related object is to position a plurality of chains and couple the chains together to form an atomic chain circuit network.

An insulated lattice is prepared with a plurality of lattice oriented atoms to create a substantially planar surface having a lattice arrangement. Any unsatisfied chemical bonds are terminated along the substantially planar surface by placing atoms at the site of the unsatisfied chemical bonds to terminate the unsatisfied chemical bonds and insulate the surface to form an insulated lattice platform.

Atoms are placed at predetermined locations on the insulated lattice platform to form a first atomic chain which behaves as one of a conductor, a semiconductor and an insulator. A second chain of atoms is also placed at predetermined locations on the insulated lattice platform so that the second chain behaves as another of a conductor, a semiconductor and an insulator. These placements are made such that the second chain of atoms is electrically coupled to the first chain of atoms, and the second chain of atoms behaves differently than the first chain of atoms. That is, in the first chain the atoms are placed at a first separation distance and in the second chain the atoms are placed at a second separation distance, where the second separation distance is different than the first.

Other features and advantages of the invention will appear from the following description in which a preferred embodiment has been set forth in detail, in conjunction with the accompanying drawings.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
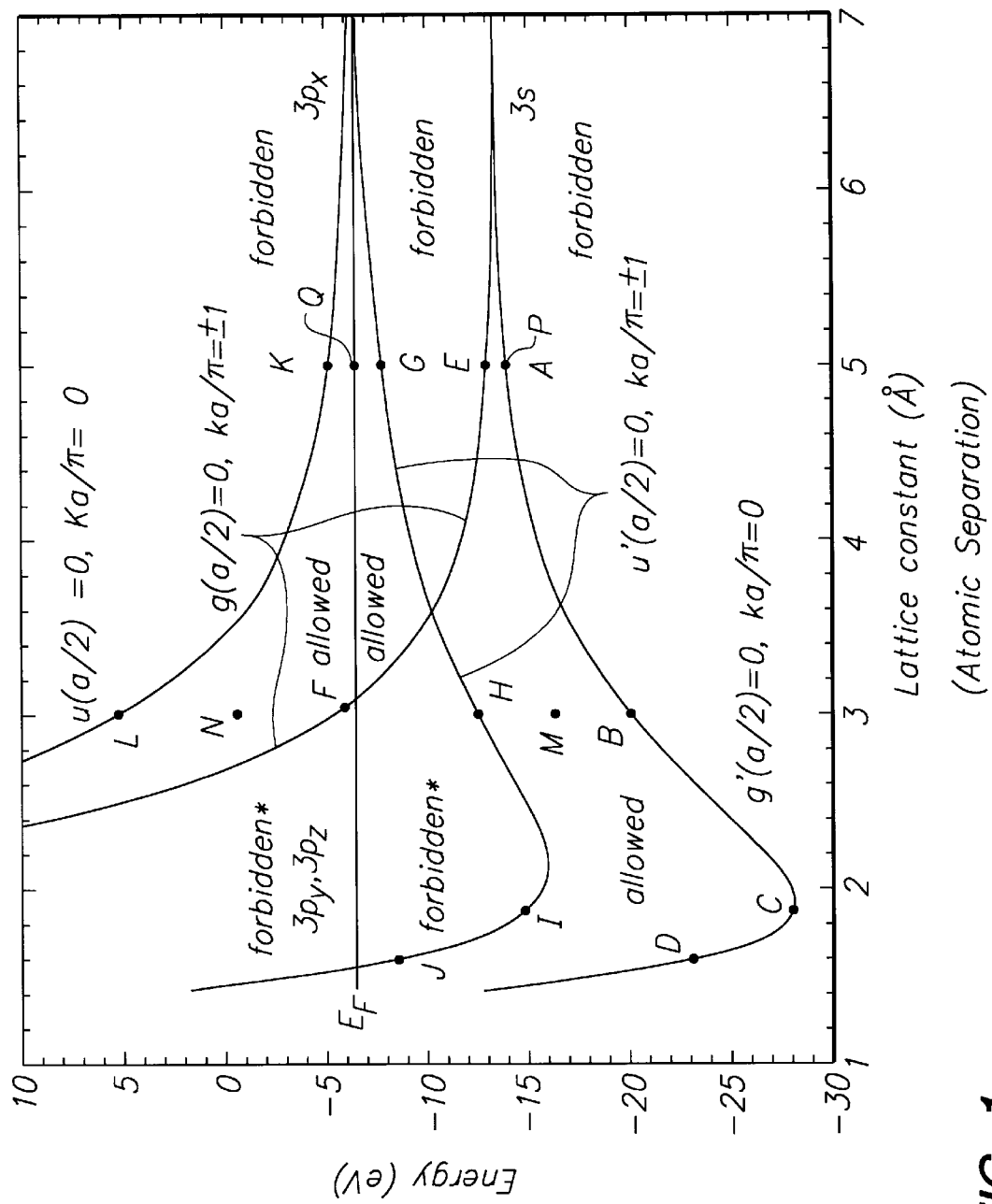
FIG. 1 shows energy band structure of silicon (Si) atomic chain as a function of lattice constant (atomic separation in Å). Energy regions are indicated by allowed and forbidden regions according to real and complex crystal momenta, respectively. States A, B, C, etc. are used to study the effect of lattice constant and the usage is common in the following figures. A thick line indicates the discrete $3p_y$, $3p_z$ state and coincides the Fermi level.

Preferred embodiments are directed toward making an atomic chain circuit network. The detailed description is organized to describe the general aspects of the invention and then the specific aspects of the invention along with specific configurations and applications. While the invention is disclosed with respect to specific embodiments, those skilled in the art will recognize that various modifications can be made while remaining within the scope of the claims.

INTRODUCTION

The present invention is directed at an atomic-scale circuit network, which is considered the smallest possible technology with the smallest possible element—an atom. Unlike traditional concepts which construct a circuit by creating electrical and optical devices, and signal transmission lines by various metal, insulator, and semiconductor materials, the present embodiment proposes to use one-kind of atoms with various lattice constants. These atoms are group IVA and include carbon (C), silicon (Si) and germanium (Ge). As discussed later, we show that it is possible to control the Fermi energy and the band structure by changing the lattice constants, and obtain metal, semiconductor, or insulator states. Based on this feature the present embodiment provides atomic-scale circuits, which are much smaller than the conventional circuit network. We also show that by using similar and other kinds of atoms, it is possible to create a gate, a switch, and a carrier trap.

Due to recent progress in atom manipulation technology, it is now possible to move atoms one by one and arrange them as desired on a substrate. It has been experimentally observed that there are preferred sites where moved atoms are likely to relocate, and thus, the substrate surface provides an array of potential wells where electrons can be preferably placed. Making use of this potential well array, it is technologically possible to arrange atoms periodically along a line on the given substrate. When such arranged atoms are isolated from substrate surface atoms so that no chemical bonds are formed between them and the interaction is practically restricted only between arranged atoms, they form a one-dimensional (1D) system for electrons, or an atomic chain. An interesting feature of this system is that the strength of the neighboring atom interaction is changed by assigning different values for the lattice constant a (atomic separation). This is done, for example, by placing atoms at every one, two, three, etc., potential wells, or changing the chain direction with respect to the crystal orientation of the substrate surface. When the lattice constant is very large, the neighboring atom interaction is so weak that electrons are confined to each atom and have discrete energy levels such that 1s, 2s, 2p, etc. like those in an isolated atom. With reducing the lattice constant, the neighboring atom interaction will cause to form a band with continuous momentum along the chain direction. Since the interaction strength can be changed with the lattice constant, the band width and the band gap can be designed as desired.

Figure 2:
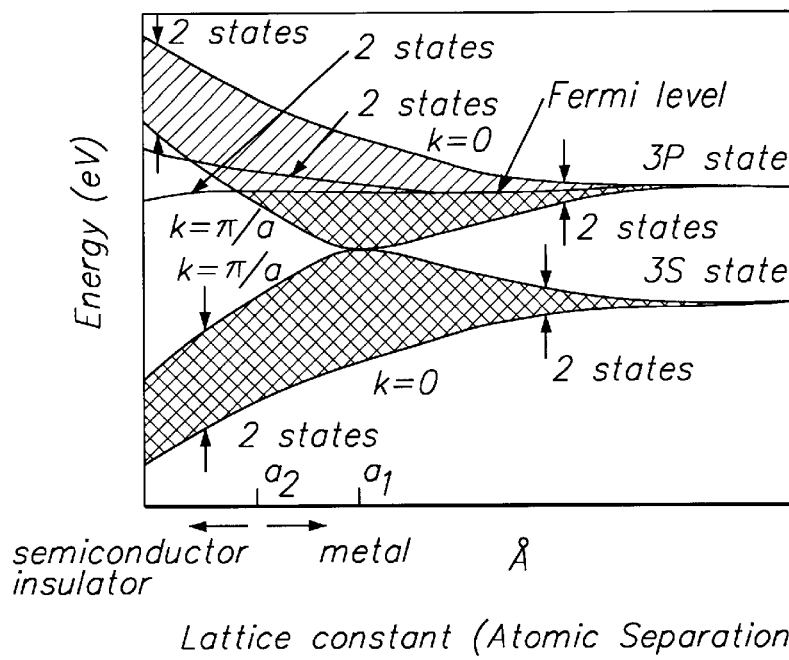
FIG. 2 shows the band structure of a Si atomic chain as a function of lattice constant (scales not exact).

In this embodiment, the band structure for an atomic chain consisting of Si, the most common material in the present semiconductor technology, is set forth in detail. A graph is shown in FIGS. 1 and 2 that depicts the energy as a function of lattice constant (atomic separation). A Si atom has fourteen electrons, where ten electrons form an extremely stable electron configuration of Ne, and practically four extra electrons determine the physical properties of Si atomic chain. The energy states for these four electrons are considered. The chain direction is taken as x-axis and an assumption is made that coupling occurs only between 3s and $3p_x$ states so that $sp_x$-hybrid will be formed, and that the $3p_y$ and $3p_z$ states remain unchanged in the atomic chain structure. When the lattice constant is large (the right end of the figure) so that there is practically no coupling between neighboring atoms, the allowed energy levels are just those of atomic levels such as 3s and 3p. As shown there is a metal-insulator transition at the lattice constant of 3.04 Å. The metal phase is realized for larger lattice constant, and the insulator phase is realized for smaller lattice constant. This seems counterintuitive, but it can be understood by that a strong covalent double-bond cannot be completely formed between the neighboring Si atoms for larger lattice constant and electrons can move freely along the chain, while a covalent double-bond is formed for smaller lattice constant, and electrons are spatially confined at the $3p_y$, $3p_z$ states perpendicular to the chain. Well inside the metal phase, there are two bands: the lower is the 3s state slightly modulated by the 3p state, and the upper is the $3p_x$ states slightly modulated by the 3s state. The Fermi level is inside the upper band and this makes the chain metallic. In the insulator phase, however, coupling is so strong that the bottom and the top of each band are originated from different states—the 3s and $3p_x$ states. Since the upper band is above the discrete $3p_y$, $3p_z$ level, the Fermi level is fixed to this discrete level, and this is why the chain is an insulator.

A MODEL ATOMIC CHAIN

At this stage a cellular method is used to determine an energy band structure. This method is excellent in providing an intuitive physical picture and is fairly quantitatively accurate. A neutral, isolated Si atom has fourteen electrons. Ten of them form a quite stable closed-shell electronconfiguration of Ne where 1s, 2s, $2p_x$, $2p_y$, and $2p_z$ states are completely filled, and all the usual physical properties are determined by four extra electrons. Two of these extra electrons completely occupy the 3s states capable of accommodating two electrons with spin degree of freedom, and the other two occupy the 3p states capable of accommodating six electrons, thereby filling ⅓ of the allowed positions.

If an atomic chain is formed in the x direction, there is coupling between atomic states such as 3s or 3p due to the neighboring atom interaction. The 3s (with spherical symmetry), $3p_y$ (with angular dependence of y/r, where $r=(x^2+y^2+z^2)^{1/2}$, and $3p_z$ (with angular dependence of z/r) states are even under the inversion of x-axis with respect to the nuclear position, and only $3p_x$ (with angular dependence of x/r) state is odd. In this neighboring atom interaction, an even-parity state and an odd-parity state can couple in general to form a band. However, the coupling between $3p_y$ and $3p_x$, or between $3p_z$ and $3p_x$ is quite weak and negligible since $3p_y$ and $3p_z$ wave functions are zero on the x-axis where the interaction is strongest. Thus, 3s and $3p_x$ states can couple to form $sp_x$-hybrid, and $3p_y$, $3p_z$ states remain unmodified in the first approximation. Each atom is assumed to preserve an almost spherical shape in the neighborhood of the x-axis, even when the atomic chain is formed. The following example shows how the 3s and $3p_x$ states couple as the lattice constant is reduced. Since the x-axis is of great importance, a wave function along the x-axis such that $\psi(x,0,0)$ is considered, and is denoted as y(x) except when confusion would result.

A general solution $\psi_1(x)$ of the Schrödinger equation inside cell 1 for given electron energy E can be formed by linear combination of an even function g(x) and an odd function u(x) with respect to the nuclear position, where x is the coordinate inside the cell with a period a ($-a/2<x<a/2$) and the origin is taken at the nuclear position. Then, $$\psi_1(x)=Ag(x)+Bu(x) \qquad (1)$$

where A and B are complex numbers, and g(x) and u(x) are calculated numerically. Once the wave function $\psi_1$ in cell 1 is calculated, all the wave functions in other cells are determined by the Bloch theorem, which requires that the wave function $\psi_{n+1}(x)$ in the n+1th cell be given, denoting crystal momentum by k, as $$\psi_{n+1}(x)=\exp(inka)\psi_1(x-na) \quad (2)$$

for $(n-\frac{1}{2})a<x<(n+\frac{1}{2})a$.

For an arbitrary combination of A and B, however, cell wave functions do not connect smoothly at cell boundaries. Smooth connection is possible only for special combinations, which are found by requiring that the value and the derivative of the wave functions be continuous at the center of the cell boundary (Wigner-Seitz) planes. Then, all the requirements at each cell boundary reduce to one same condition such that $$\psi_1(a/2)=\exp(ika)\psi_1(-a/2),$$

$$d\psi(a/2)/dx=\exp(ika)d\psi(-a/2)/dx \quad (3)$$

Next, Equation (2) is inserted into Equation (3) and using the symmetry properties such that $g(-a/2)=g(a/2)$, $g'(-a/2)=-g'(a/2)$, etc., resulting in the matrix equation:

$$[1-\exp(ika)]g(a/2)A+[1+\exp(ika)]u(a/2)B=0$$

$$[1+\exp(ika)]g'(a/2)A+[1-\exp(ika)]u'(a/2)B=0 \quad (4)$$

In order to have a non-trivial solution for A and B, the determinant of Equation (4) has to vanish, which is given by, $$\tan^2(ka/2)=-[g'(a/2)u(a/2)]/[g(a/2)u'(a/2)]\equiv\sigma \quad (5)$$

The crystal momentum k as a function of E is calculated through Equation (5), and this defines the dispersion relation. The traveling wave solution is possible only when $\sigma>0$ and k is real, corresponding to an allowed energy region. When $\sigma<0$, k is generally complex and the wave decays along the chain, corresponding to a forbidden energy region.

The wave function along the chain can be constructed using the coefficients A and B that are determined by Equation (4) under the condition of Equation (5). The final form is given by $$\psi_1(x)=(u'(a/2)u(a/2))^{1/2}g(x)-(k/|k|)(g'(a/2)g(a/2))^{1/2}u(x) \quad (6)$$

where $g(x)$ and $u(x)$ need not to be normalized. The wave function $\psi_{n+1}(x)$ in the n+1th cell is calculated using Equation (2). It is noted that whenever k is real and the traveling solution is possible, only one of $g(a/2)$, $g'(a/2)$, $u(a/2)$, and $u'(a/2)$ has a different sign and the remaining three have the same sign, and therefore, one of the coefficients is real and the other is pure imaginary in Equation (6). Thus, the amplitude of the wave function is symmetric within a cell for the nuclear position and periodic from cell to cell for an allowed energy state.

This method is applied to the present problem of a Si atomic chain, where 3s and $3p_x$ wave functions on the x-axis correspond to even and odd functions $g(x)$ and $u(x)$, respectively. The radial part $R(r)$ of the Schrodinger equation for an electron in an isolated atom when expressed in atomic units has a form as $$(1/r^2)(dr^2/dr)(dR(r)/dr)+[E-l(l+1)/r^2-V(r)]R(r)=0 \quad (7)$$

where I is the angular momentum. The function $V(r)$, a nuclear Coulomb potential including the effect of Coulomb repulsion and exchange interaction by other electrons self-consistently, is defined by $$V(r)=-z(r)/r \quad (8)$$

where the effective nuclear charge $z(r)>0$ is given in a numerical table by Herman and Skillman. Since $z(r)$ represents the effects of the other 13 electrons excluding the one in consideration, it is a monotone decreasing function with the limiting values of $z(0)=14$ and $z(\infty)=1$.

The Schrödinger equation (7) must be solved for given energy E, and $g(a/2)$, $g'(a/2)$, $u(a/2)$, and $u'(a/2)$ calculated numerically. This is done easily by introducing a new function $P(r)$ defined by $P(r)=rR(r)$. Then, Equation (7) is rewritten by $$d^2P(r)/dr^2+F(r)P(r)=0 \quad (9)$$

where $$F(r)=E-I(I+1)/r^2-V(r) \quad (10)$$

An appropriate initial condition has to be found to obtain 3s and $3p_x$ wave functions. Since $F(r)$ has divergent terms when $r\to 0$, the initial condition has to be given avoiding the origin. A wave function with angular momentum I is characterized by the behavior around the origin by $$P(r)\sim r^{I+1} \quad (11)$$

where $I=0$ corresponds to the 3s state and $I=1$ to the $3p_x$ state. These values serve as an initial condition for numerical integration. Integration determines $P(a/2)$ and $P'(a/2)$, and they are immediately converted to $R(a/2)$ and $R'(a/2)$. This is done for even and odd solutions and all the necessary values $g(a/2)$, $g'(a/2)$, $u(a/2)$, and $u'(a/2)$ are determined to calculate $\sigma$ for given E. Then, the dispersion relation is obtained through Equation (5) and the wave function is constructed through Equation (6). It is an energy value E that guarantees 3s or 3p wave functions. In fact, the expression in Equation (11) just describes the wave function with angular momentum I and may accidentally correspond to 4s, 4p, 5s, 5p, etc. functions with a different number of zeros. The careful input of E is necessary.

APPLICATION TO GROUP IVA SILICON

FIG. 1 shows the band structure of a Si atomic chain as a function of lattice constant a. The 3s and $3p_x$ wave functions are calculated for a given pair of lattice constant a and energy E, and $g(a/2)$, $g'(a/2)$, $u(a/2)$, and $u'(a/2)$ are numerically evaluated to give s in Equation (5). Allowed energy regions are for $\sigma>0$, and forbidden energy regions are for $\sigma<0$. When the lattice constant is extremely large, e.g., 7 Å, allowed energy levels are very close to discrete atomic 3s and 3p levels at −13.6 eV and −6.53 eV, respectively. As the lattice constant is reduced, the band gap narrows as each allowed band broadens, and at a=3.56 Å, the band gap seems to disappear. Further decrease in lattice constant opens the band gap again. The following seven points are noted:

First, the band boundaries between allowed and forbidden energy regions are given by either $\sigma=0$ or $\sigma=\pm\infty$. When $\sigma=0$, we have either a curve $g'(a/2)=0$ (along A, B, C, and D), or a curve $u(a/2)=0$ (K and L). The crystal momentum k is zero for both cases. When $CT=\pm\infty$, we have either a curve $g(a/2)=0$ (E and F), or a curve $u'(a/2)=0$ (G, H, I, and J). The crystal momentum k is at the Brillouin zone edge, given by $ka/\pi=\pm 1$. All the band gaps between the allowed bands are direct.

Second, as the lattice constant is reduced, allowed energy regions for 3s and $3p_x$ states broaden due to the neighboring atom interaction, while $3p_y$ and $3p_z$ levels are assumed to be unchanged since they cannot couple with the $3P_x$ state. Each 3s, $3P_x$, $3p_y$, and $3p_z$ state can accommodate two electrons per atom, with spin degree of freedom. This accommodation number, or the number of states per atom, remains the same even after the neighboring atom interaction is introduced and allowed energy bands broaden. Since four extra electrons per atom have to be accommodated, the Fermi level is always fixed at −6.53 eV, which is at the energy of the discrete $3p_y$, $3p_z$ state, regardless of the lattice constant value a. Thus, there is a phase transition at a=3.04 Å, where the curve g(a/2)=0 intersects the $3p_y$, $3p_z$ level line. For a >3.04 Å, the Fermi level is inside the allowed energy band and the atomic chain becomes metal. For a <3.04 Å, the Fermi level is at the discrete $3p_y$, $3p_z$ level inside the forbidden energy region, and the chain becomes insulator. This is because a strong covalent double-bond is only partially formed between neighboring Si atoms for larger lattice constant and electrons can move freely along the chain, while such bond is fully formed for smaller lattice constant, and electrons are spatially confined at the 3p states perpendicular to the x-axis.

Third, since the band width is decreasingly small with increasing lattice constant, there will be a practical upper limit for the lattice constant that can realize the metal phase. In fact, any fluctuation (in neighboring atom distance, substrate potential, etc.) comparable with the neighboring atom interaction will destroy the metal phase and cause electrons to localize at each atom. This means a chain with longer lattice constant is more vulnerable to fluctuation.

Fourth, for a >3.56 Å, the bottom and the top of an allowed band are originated from the same atomic wave function, and for a <3.56 Å, they are from different wave functions. For example, state A with a=5 Å corresponds to an array of 3s wave function with a polarity of +1, +1, +1, +1, . . . from cell to cell, and state E also corresponds to an array of 3s wave function, but with a polarity of +1, −1, +1, −1, . . . . An intermediate state is a mixture of 3s and $3p_x$ states. However, state B with a=3 Å corresponds to an array of 3s function with a polarity of +1, +1, +1, +1, . . . , and state H corresponds to an array of $3p_x$ function with a polarity of +1, −1, +1, −1, Intermediate state M is again a mixture of 3s and $3p_x$ states.

Fifth, there is a minimum around a=1.88 Å for the curve g'(a/2)=0 (along A, B, C, and D). A minimum is around a=2.09 Å for the curve u(a/2)=0 (G, H, I, and J). An appropriately averaged lattice constant of these two realizes the least energy state, and corresponds to the natural lattice constant for a Si atomic chain under the present model. The energy decreases with lattice constant mainly due to the reduction of cell boundary part where the atomic potential is shallowest (smallest in depth). For further smaller lattice constant, average electron kinetic energy hikes since electrons are forced to locate in narrow cells, and the usual size quantization effect prevails. These situations will be discussed later in connection with the shape of the wave function. In reality, the hike of the curve g'(a/2)=0 should also be caused by the Pauli exclusion principle as in an argument of the Lennard-Jones potential, but this effect is not included here. Regardless of possible errors, R has to be emphasized that the band structure in FIG. 1 is topologically correct and the natural lattice constant is realized in the insulator side.

Sixth, the discrete $3p_y$, $3p_z$ level may split into two levels due to the neighboring atom interaction as schematically drawn in FIG. 2 (scale not exact), although the splitting is expected to be small. Even if this is the case, there is still a metal-insulator transition in the neighborhood of 3 Å since the Fermi level is fixed at the top of the lower level, i.e., the lower level is completely filled.

Seventh, electrons with positive energy are not confined by atomic potential in the y- and z- directions. Thus, the band structure is meaningful only for negative values of energy, although the wave function for positive energy will be studied below to show how the wave function changes with the lattice constant.

Figure 3D:
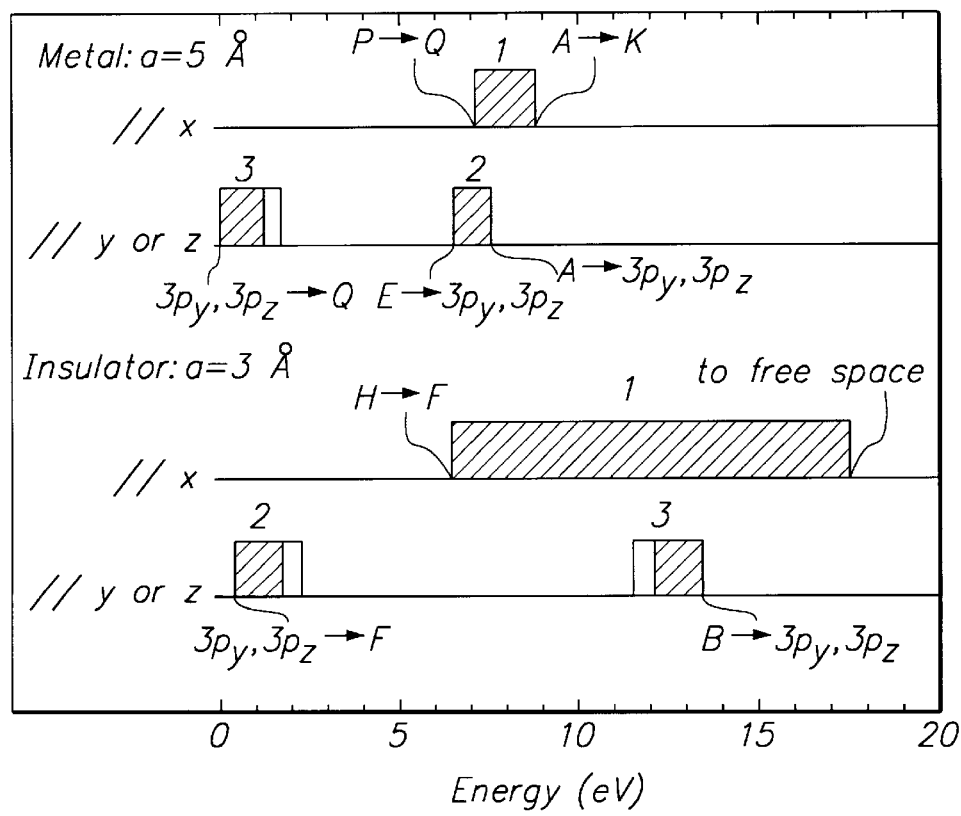
FIG. 3(d) shows dispersion for the three different lattice constants of FIGS. 3(a)–(b) in a different graphical representation and where the // marks indicate the polarity of the light.
Figure 3A:
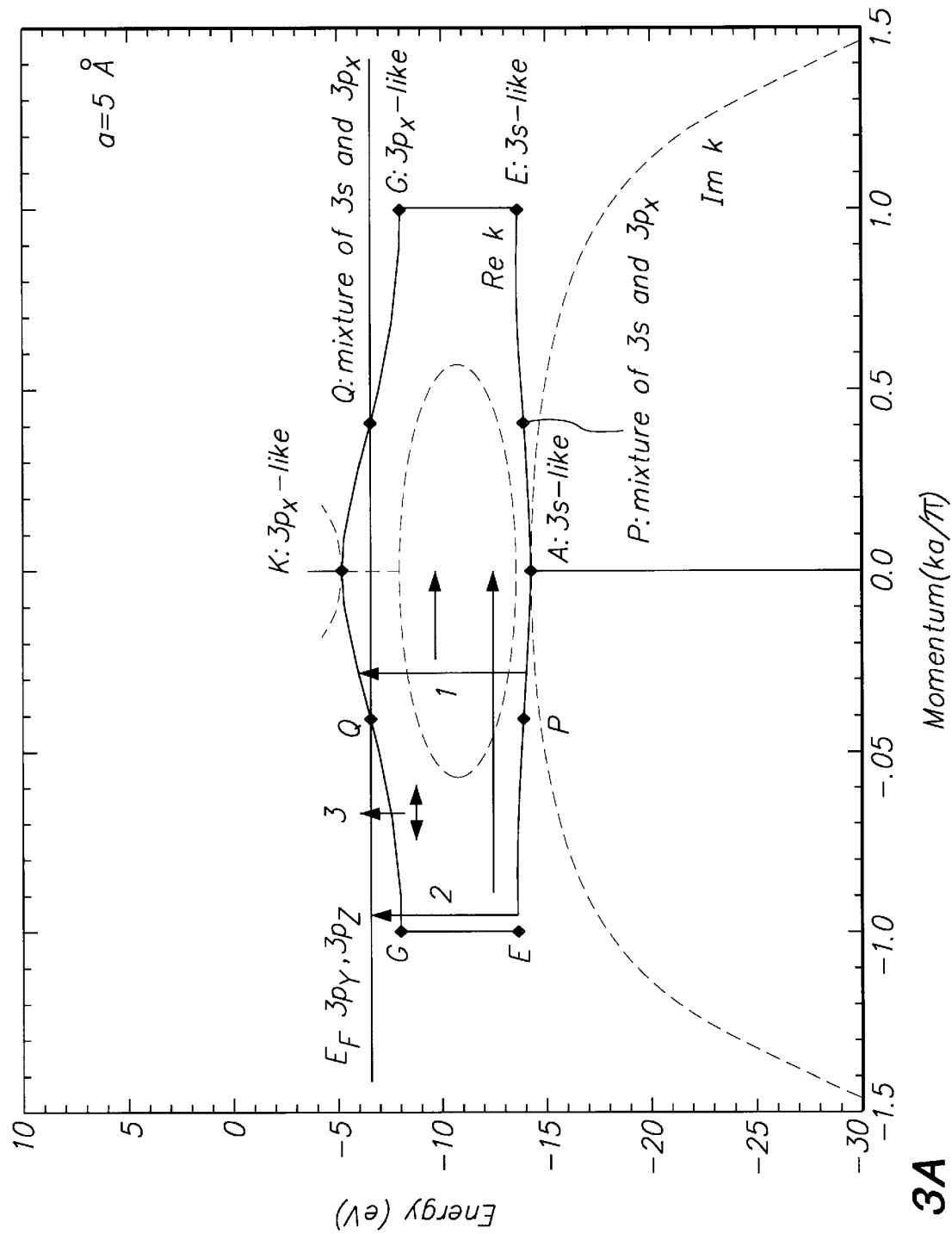
FIGS. 3(a)–(c) show dispersion for three different lattice constant values: (a) a=5 Å, (b) 3 Å, and (c) 1.88 Å where solid curves show the real part of and dotted curves show the imaginary part of the crystal momentum, and a thick line shows the discrete $3p_y$, $3p_z$ state and coincides the Fermi level. Arrows show possible optical transitions.
Figure 3B:
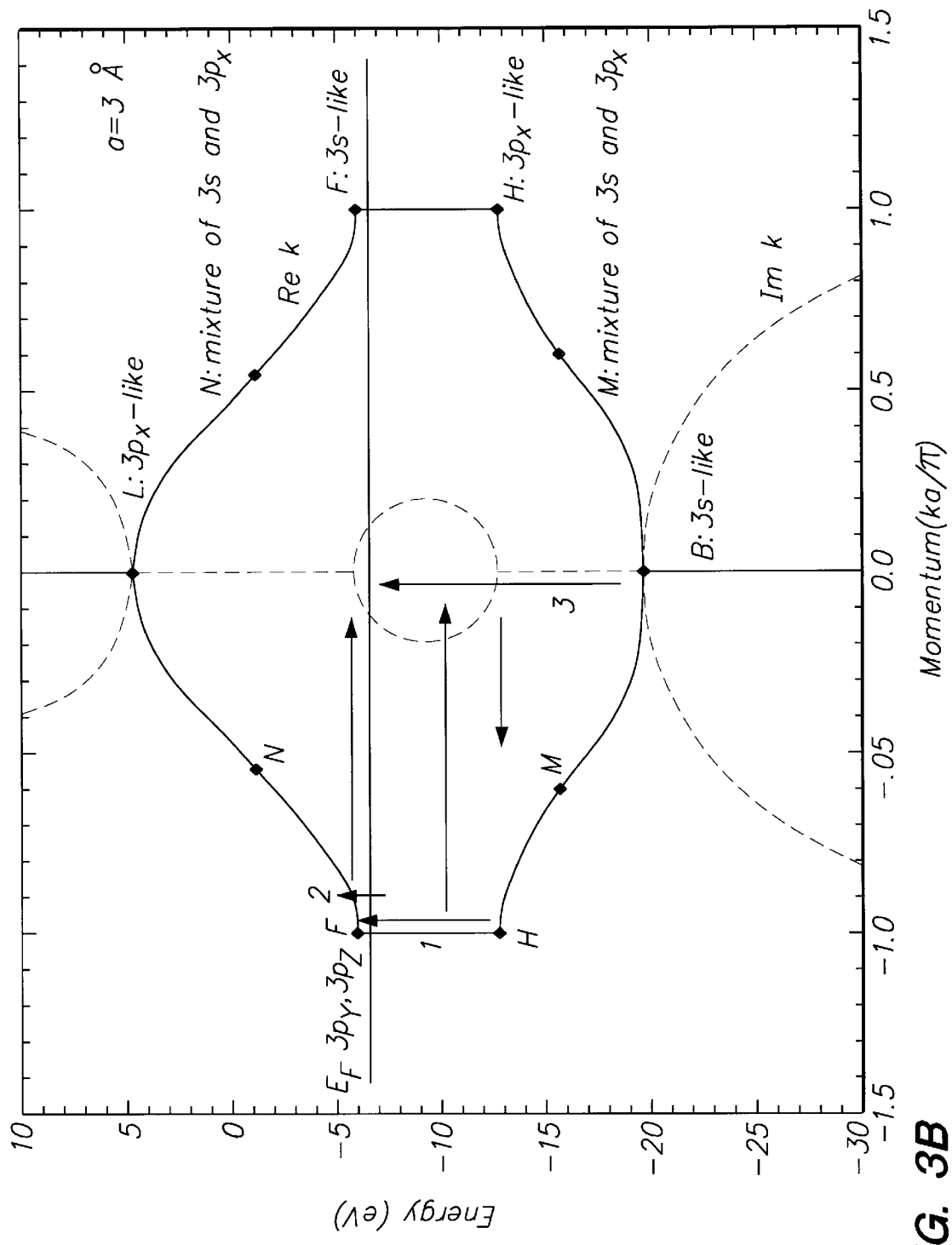
Figure 3C:
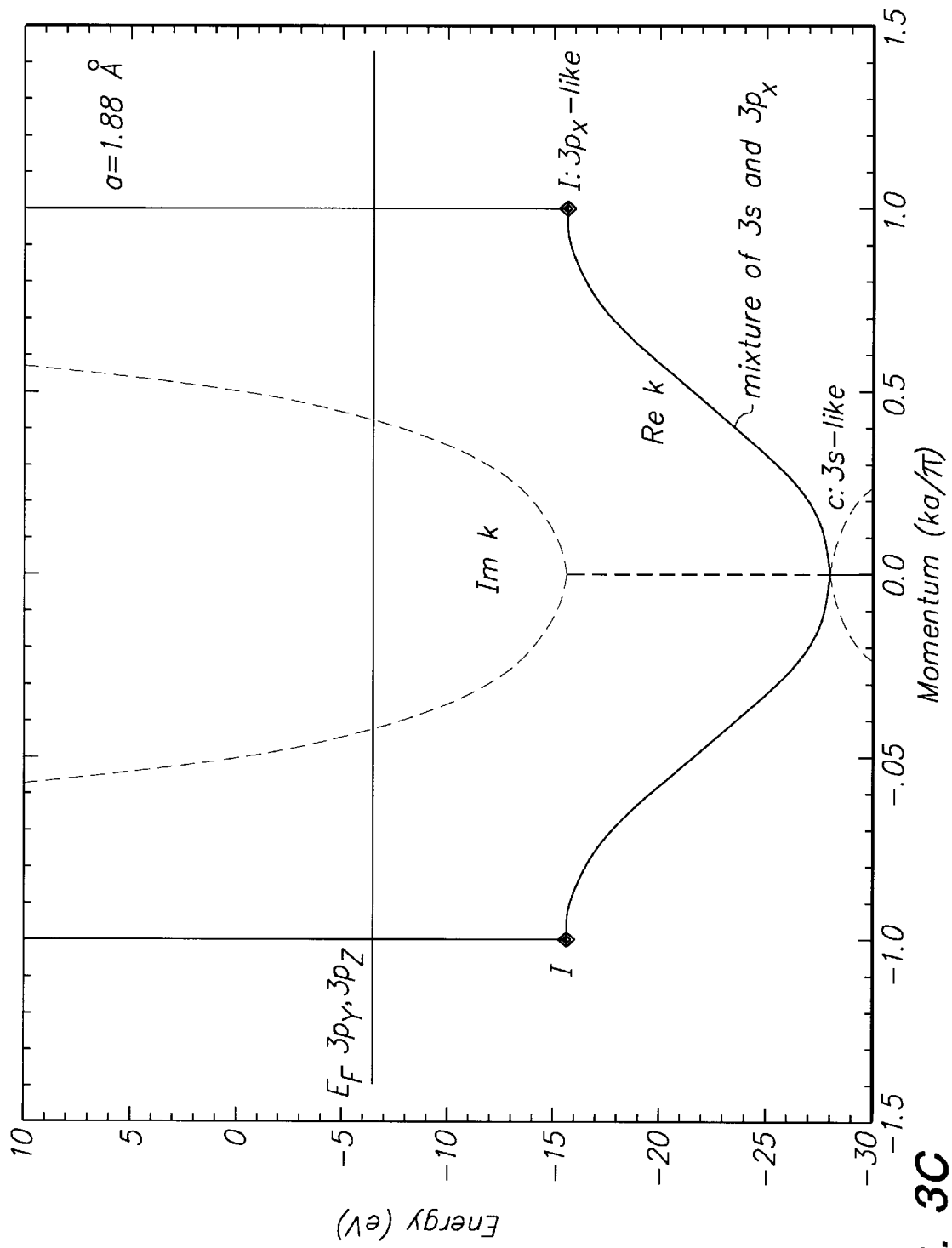

FIGS. 3(a)–(c) show the dispersion for three different lattice constant values: (a) a=5 Å, (b) a=3 Å, and (c) a=1.88 Å. Solid curves show the real part of and dotted curves show the imaginary part of the crystal momentum, and a thick line shows the discrete localized $3p_y$, $3p_z$ state. A spatially localized state spreads in momentum space due to the Heisenberg principle and is shown such way. States A, E, G, K, etc. correspond to those in FIG. 1 In each plot, there are three prototype regions, according to three different σ values. They are (i) an allowed energy region where k is real (σ>0) (ii) a forbidden energy region where k is pure imaginary (−1<σ<0), and (iii) a forbidden energy region where k is complex with its real part equal to ± π/a (σ<−1). The difference in (ii) and (iii) is that the wave function decays without changing its polarity from cell to cell in (ii) while it decays with changing its polarity in (iii). The band gap between the upper and lower allowed bands is of type (iii). As is clearly shown in the figure, all the extremal points of energy occur at k=0 or ±π/a, and all the band gaps are direct. The electron velocity v is proportional to dE/dk, and thus, v=0 at k=0 and ±π/a. These results are all common in 1D systems. It may be considered that the lower band corresponds to the first Brillouin zone of a free electron and the upper corresponds to the second Brillouin zone, since ka/π=0 at the bottom of the lower band and ka/π=±1 at the bottom of the upper band, but the calculated energy curve is shifted significantly from that of a free electron. The typical magnitude of ka/π in the forbidden region is ~0.5, and this indicates that a chain with a few atoms is already enough to see a significant decay of the wave function, leading to formation of a band gap. The condition for minimal chain length for successful observation of the predicted band structure in FIG. 1 is determined by the requirement of continuous energy spectrum in allowed energy bands. FIG. 3(d) shows dispersion for the three different lattice constants of FIGS. 3(a)–(b) in a different graphical representation.

Figure 4A:
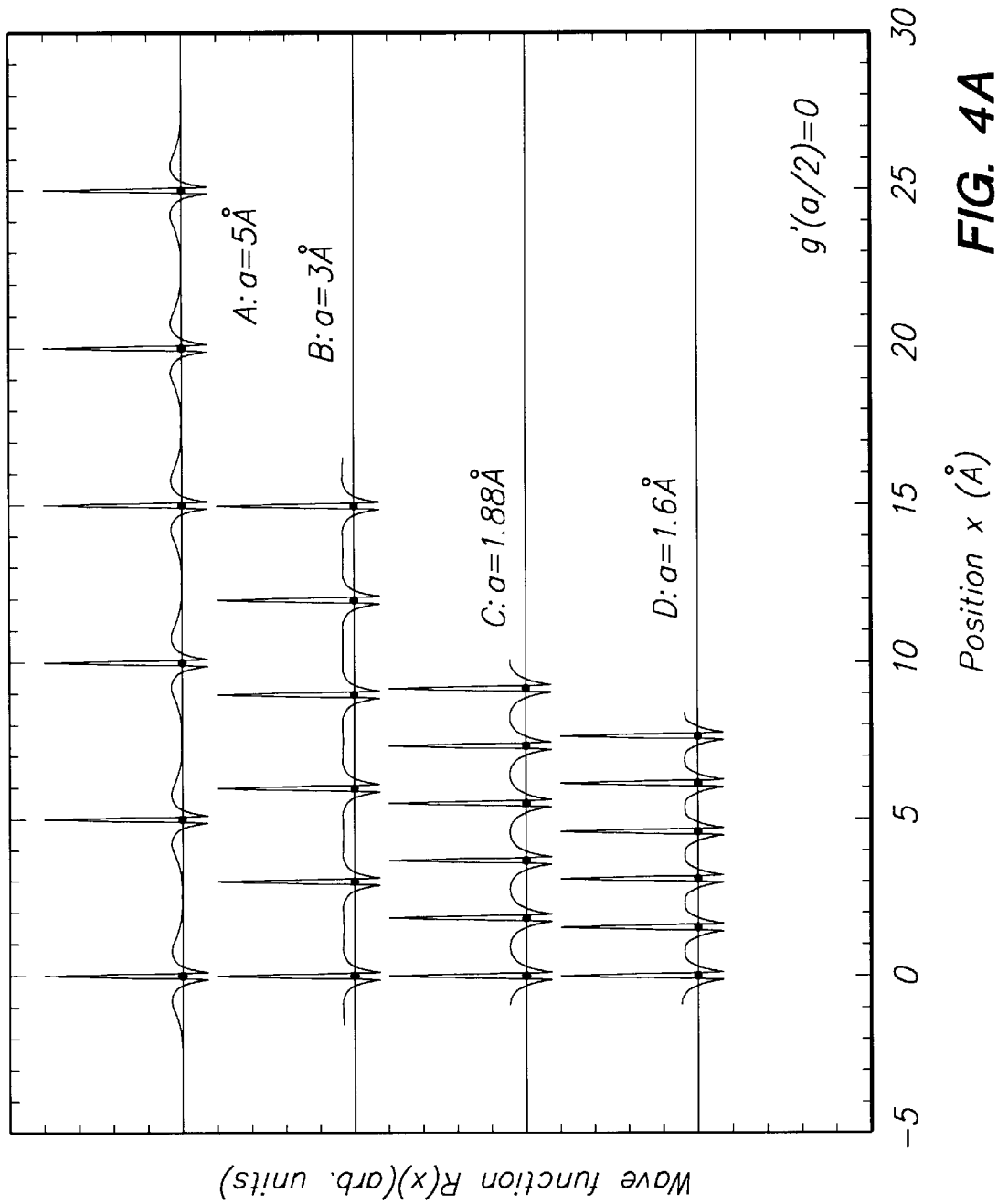
FIGS. 4(a)–(c) show wave functions along x-axis for various states marked in FIG. 1. The wave functions are not normalized and taken as real: (a) along g'(a/2)=0; (b) along u'(a/2)=0; (c) along g(a/2)=0 or u(a/2)=0.
Figure 4B:
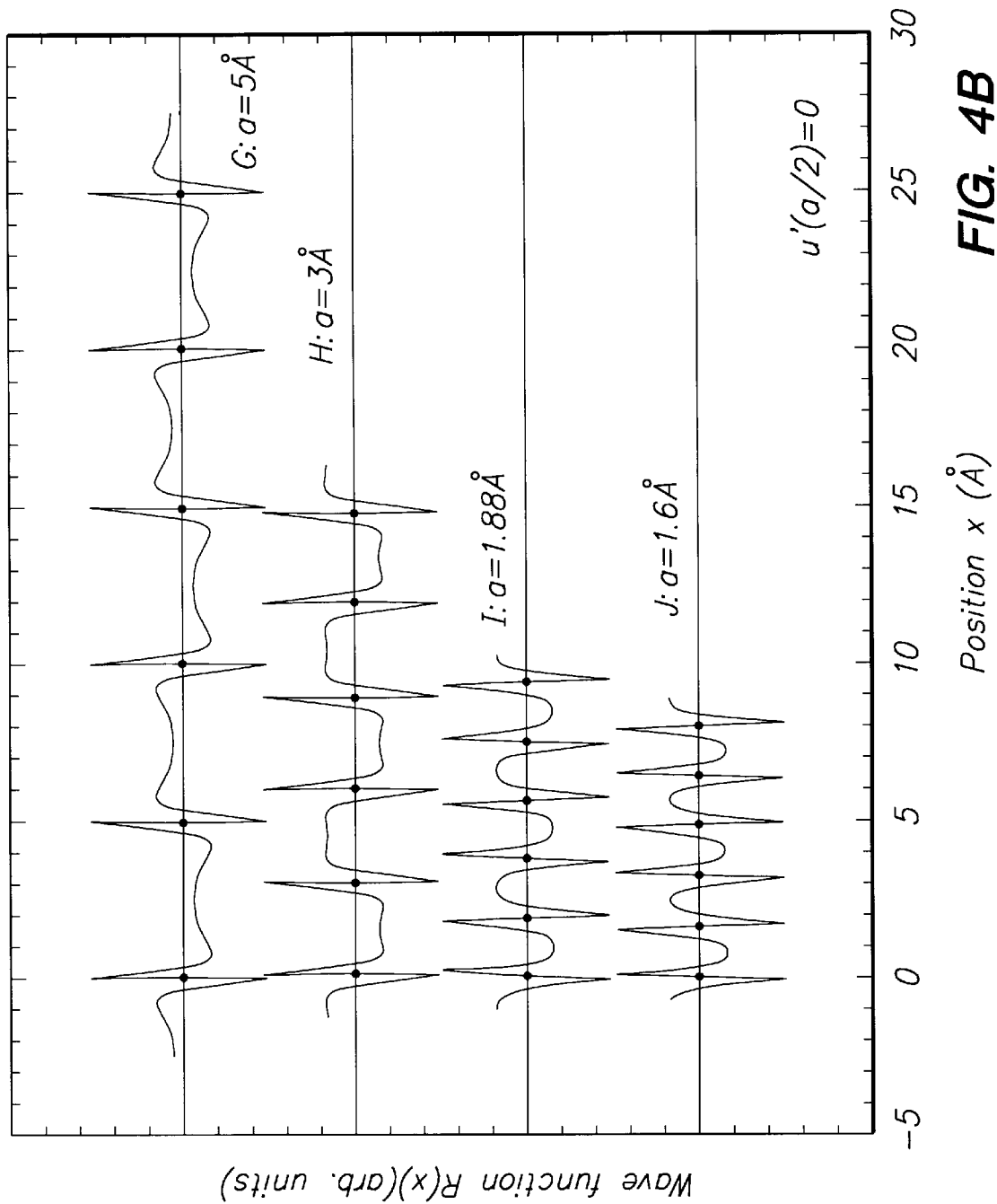
Figure 4C:
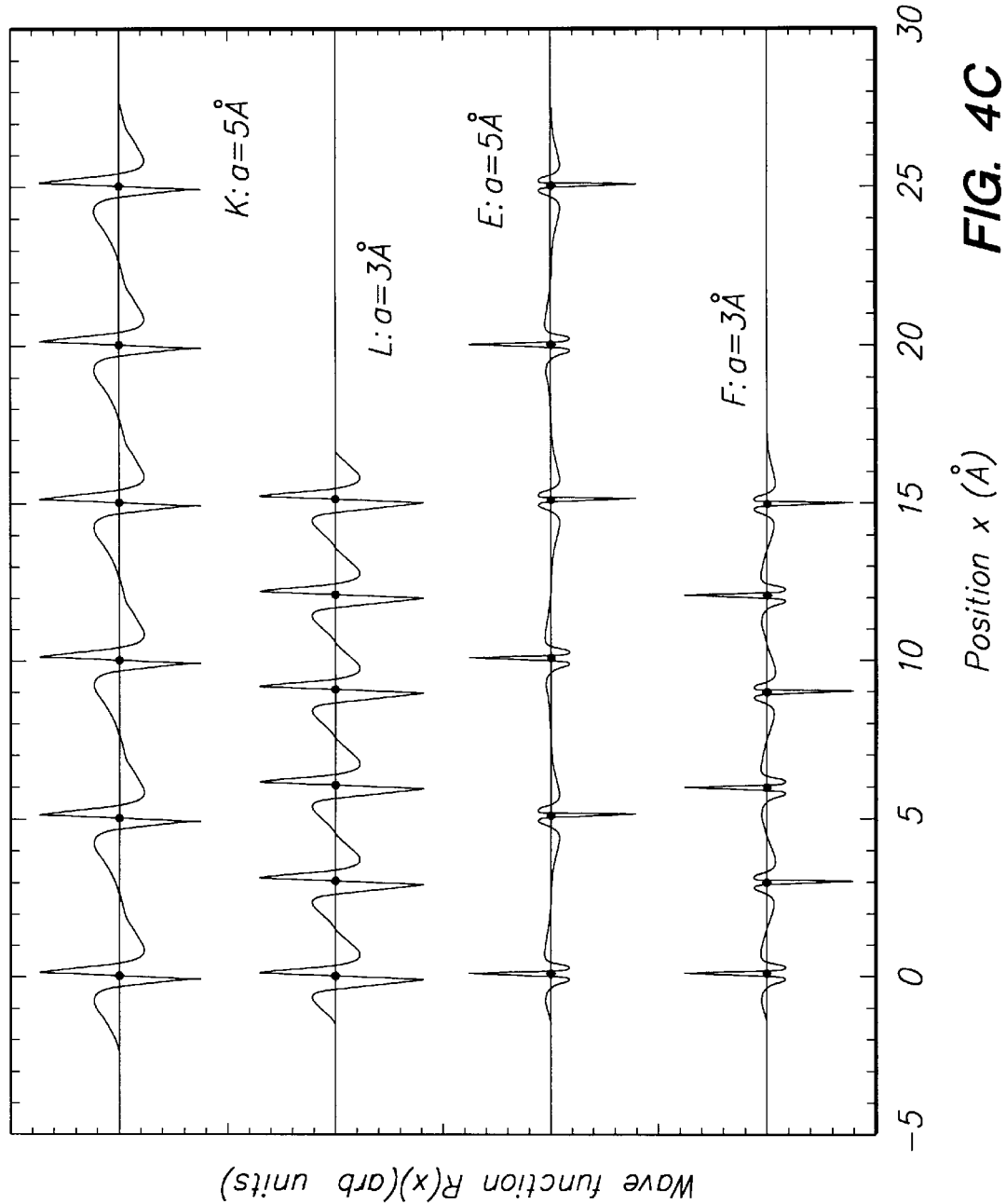

FIGS. 4(a)–(c) show wave functions of various states on band boundaries, where dots indicate nuclear positions: (a) states A, B, C, and D; (b) states G, H, I, and J; (c) states E and F, and states K and L. As is shown above, electron velocity is zero at band boundaries, which means the phase of the wave function is constant at boundaries in 1 D systems, since electron velocity v is given by v∝$|\psi|^2$D(In (ψ/ψ*))/dx=2$|\psi|^2$d(argψ)/dx. Thus, we choose the wave functions to be real in FIGS. 4(a)–(c). They are not normalized intentionally, in order to show the detailed structures for different lattice constant values. In FIG. 4(a), states A, B, C, and D are all originated from the 3s state and satisfy the boundary condition of g'(a/2)=0. The polarity of the wave function is +1, +1, +1, +1, . . . form cell to cell. For state A with a=5 Å, the wave function is close to that of 3s state in an isolated atom, with a vanishing amplitude at the cell boundaries. As the lattice constant is reduced, the wave function at cell the boundaries begins to increase in amplitude, while the wave function near the nuclear positions does not seem to change practically. For state C with a=1.88 Å, we can observe a flat portion of the wave function at the cell boundaries, and this is an explanation for the lowest energy. As the lattice constant decreases from state A to state C, the average potential energy decreases due to the reduction of cell boundary part that has shallowest (smallest in depth) potential energy. If the lattice constant is further decreased like state D with a=1.6 Å, the size quantization effect prevails, or average electron kinetic energy roughly behaves as $a^{-2}$ for smaller lattice constant, and the increase in average kinetic energy overcomes the decrease in average potential energy. In fact, the wave function at the cell boundaries has a large second derivative (sharp convex), suggesting the increase in kinetic energy. In FIG. 4(b), all the states are originated from the $3p_x$ state and satisfy the boundary condition of u'(a/2)=0. The polarity of the wave function is alternating, +1, −1, +1, −1, . . . form cell to cell. For an odd-parity wave function, this alternating polarity has smaller energy than the constant polarity of +1, +1, +1, +1, . . . . As long as the effect of reduction in lattice constant is concerned, essentially the same argument can apply to FIG. 4(b). In FIG. 4(c), the wave functions for even-parity states E and F on the curve g(a/2)=0 are shown. They are originated from the 3s state, and have the alternating polarity. Also shown are the wave functions for odd-parity states K and L on the curve u(a/2)=0. They are originated from the $3p_x$ state and have the constant polarity. The curves g(a/2)=0 and u(a/2)=0 corresponding to states E and F, and states K and L shown in FIG. 4(c) increase with decreasing lattice constant. They do not show any decrease in energy with decreasing lattice constant, and this can be consistent with the fact that the wave functions are zero at the cell boundaries as shown in FIG. 4(c). Only the size quantization effect prevails for these states.

Figure 4D:
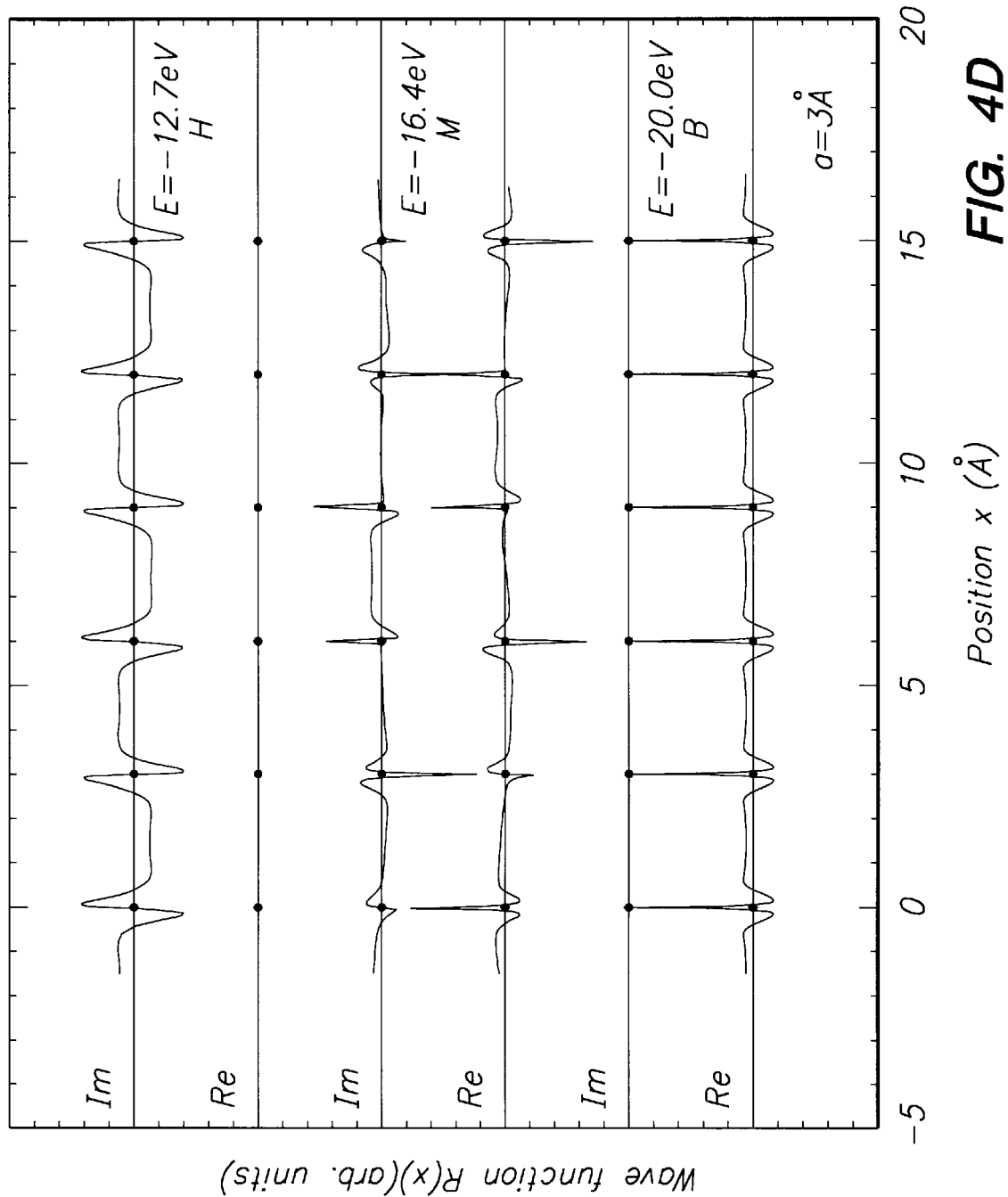
FIGS. 4(d)–(e) show wave functions mixing 3s and $3p_x$ states along x-axis for various states marked in FIG. 1. The wave functions are not normalized and the real and imaginary parts are shown.
Figure 4E:
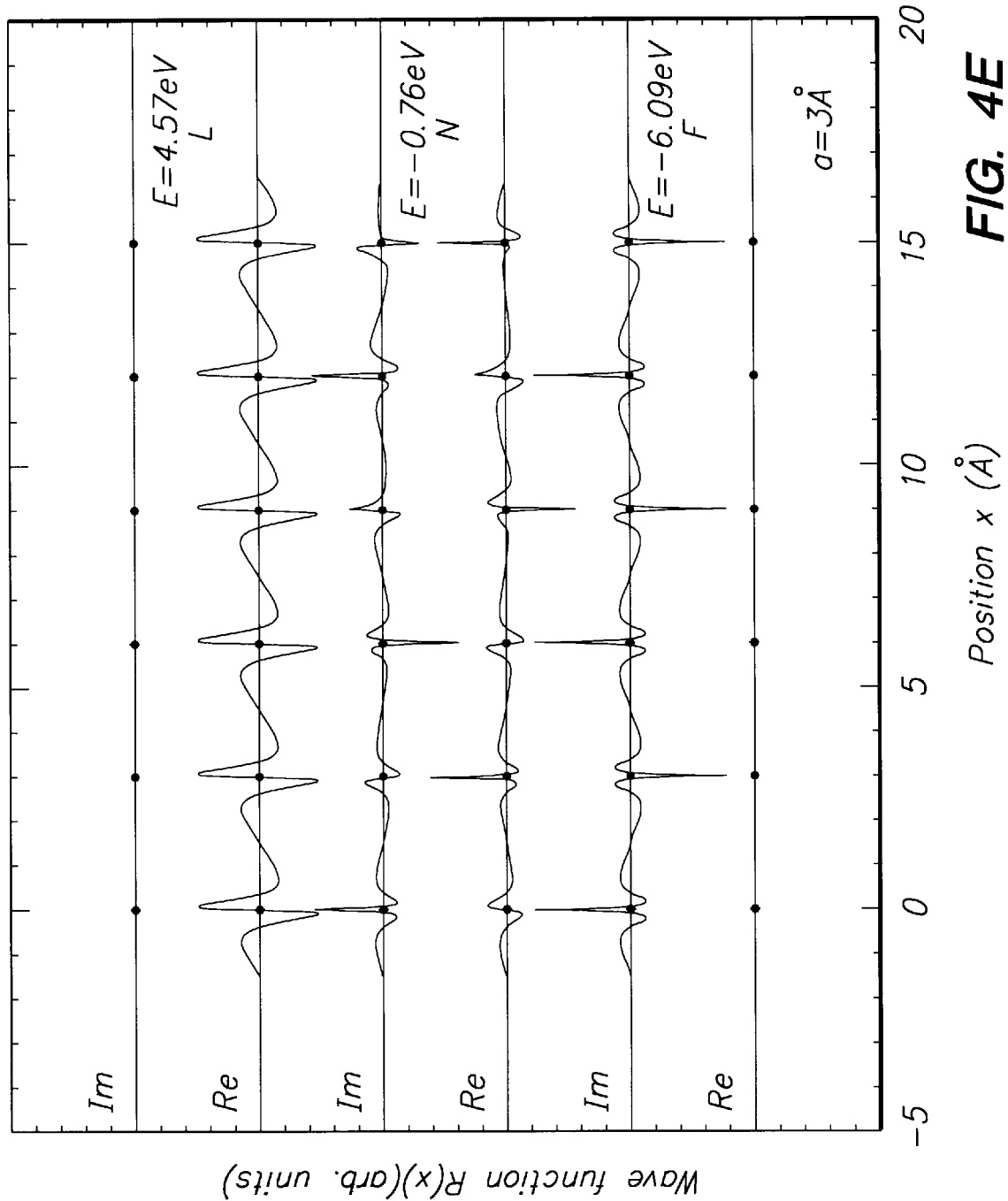

It is interesting to observe the wave functions inside allowed energy bands, in particular, states M and N. State M is located between 3s-like state B and $3p_x$-like state H, and state N is located between 3s-like state F and $3p_x$-like state L. Both states M and N are expected to have the combined nature of 3s and $3p_x$ states, and there is a spatial phase change in the wave function d(argψ)/dx≠0 since the electron velocity is nonzero. FIGS. 4(d)–(e) show this plot: (d) states B, M, and H, and (e) states F, N, and L, where for comparison, the states on the band boundaries are also shown. The real and imaginary parts of the wave function are plotted for each state, and they are not normalized for visibility. In FIG. 4(d), the wave function in a cell for state M is a linear combination of a 3s-like real function g(x) and a $3p_x$-like real function u(x), with a real coefficient for g(x) and a pure imaginary coefficient for u(x). The wave functions in the neighboring cells are generated with a phase factor according to the Bloch theorem as in Equation (2). From this construction, it is mathematically guaranteed that the amplitude of the wave function is symmetric in a cell with respect to the nuclear position, and is periodic from cell to cell. State M clearly shows the mixed nature of the 3s and $3p_x$ states. In either real or imaginary part of the wave function, the 3s-like wave function in a cell is followed by the $3p_x$-like wave function after some periods. The linear combination with the least weight of $3p_x$ state is state B and the linear combination with the least weight of 3s state is state H. The wave function for state B is taken as real and the polarity is constant, +1, +1, +1,+1, . . . from cell to cell and there is no phase change. The wave function for state H is taken as pure imaginary and the polarity is alternating, +1, −1, +1, −1, . . . . State M is located between states B and H, and its phase increases (k>0) or decreases (k<0) monotonically from cell to cell by a factor exp(ika) (0<|arg[exp(ika)] |<π) as required by the Bloch theorem. The similar argument applies to FIG. 4(e), where the wave functions for states F, N, and L are plotted.

We have assumed that the wave function preserves its spherical shape even in the atomic chain, in the neighborhood of the x-axis such that $\psi_1(x,y,z)=R(r)S((\theta,\Theta))$, with $r=(x^2+y^2+z^2)^{1/2}$, and dealt with the solution of $\psi_1(x,0,0)$. The true wave function should decay exponentially in the y- and zdirections like an isolated atom, and there is a modulation only in the x direction due to the neighboring atom interaction. The present treatment has not derived the shape of the wave function in the y- and z-directions, but concentrated on the wave function in the x-direction, and the essential features of the function $\psi_1(x,0,0)$ have been captured. It may be possible to improve this point, by writing the wave function $\psi_1$ in cell 1 as $\psi_1(x,y,z)=R(x,p)S(\Theta)$, where $p=(y^2+Z^2)^{1/2}$ and $\Theta=\tan^{-1}(y/p)$, although the mathematical treatment is complicated since the function R depends explicitly on x, and cannot be expressed by a simple product of the function of x and the function of p. The self-consistent nuclear Coulomb potential has to be re-derived so that it will be only cylindrically symmetric around the x-axis, but this approach is more like a first principle band calculation for the atomic chain itself, and there seems not a practical merit.

In order to improve the present method quantitatively without changing the present algorithm, we can increase the number of wave functions to expand $\psi_1$, where only 3s and $3p_x$ wave functions have been used, motivated by that the numerical Fourier transform improves with increasing the number of bases. It is quite possible to include higher energy functions, such as 3D functions. These d functions with I=2 have angular dependence of $(x^2-y^2)/r^2$, $yz/r^2$, $zx/r^2$, $xy/r^2$, and $(3z^2-r^2)/(2r^2)$. The first and last functions survive at (x,0,0), and contribute to the even part of the wave function g(x) for the matching at (a/2,0,0). With increasing the number of expansion functions, the number of matching conditions on the cell boundary plane has to be increased. The matching at points other than (a/2,0,0) should be considered, and also the tangential-derivative matching as well as normal-derivative matching could be used. However, these effort may not drastically improve the quantitative result, as suggested by Shockley's empty lattice test.

Many-body effects such as the direct Coulomb and exchange interactions have been included in the self-consistent potential V(r), and the problem has been reduced to a one-body problem. If a complete treatment of many-body effects is sought, the possibility of using a first-principle method can be considered.

APPLICATION ONTO AN INSULATED PLATFORM

In order to position the individual atoms, an insulated support must be prepared. A substrate is used and an insulator applied thereover to isolate the atomic chain from the substrate. Atoms constituting the chain should not be attached chemically to substrate surface atoms by formation of covalent bonds, but should be attached physically. These requirements can be satisfied with careful choice and proper process of the substrate surface. One possibility is to use an insulating Si substrate with uppermost surface atoms being terminated by other appropriate atoms, such as hydrogen, so that the unsatisfied bonds of surface atoms are neutralized. Another possibility is to use a reconstructed substrate, where unsatisfied bonds satisfy one another to create an insulated surface. Still another possibility is to use a molecular substrate that does not have unsatisfied bonds at the surface, for example, a tetrahedral molecular crystal. In any case, an optimal surface for atomic placement is one with a periodic lattice structure and without unsatisfied bonds.

Figure 5:
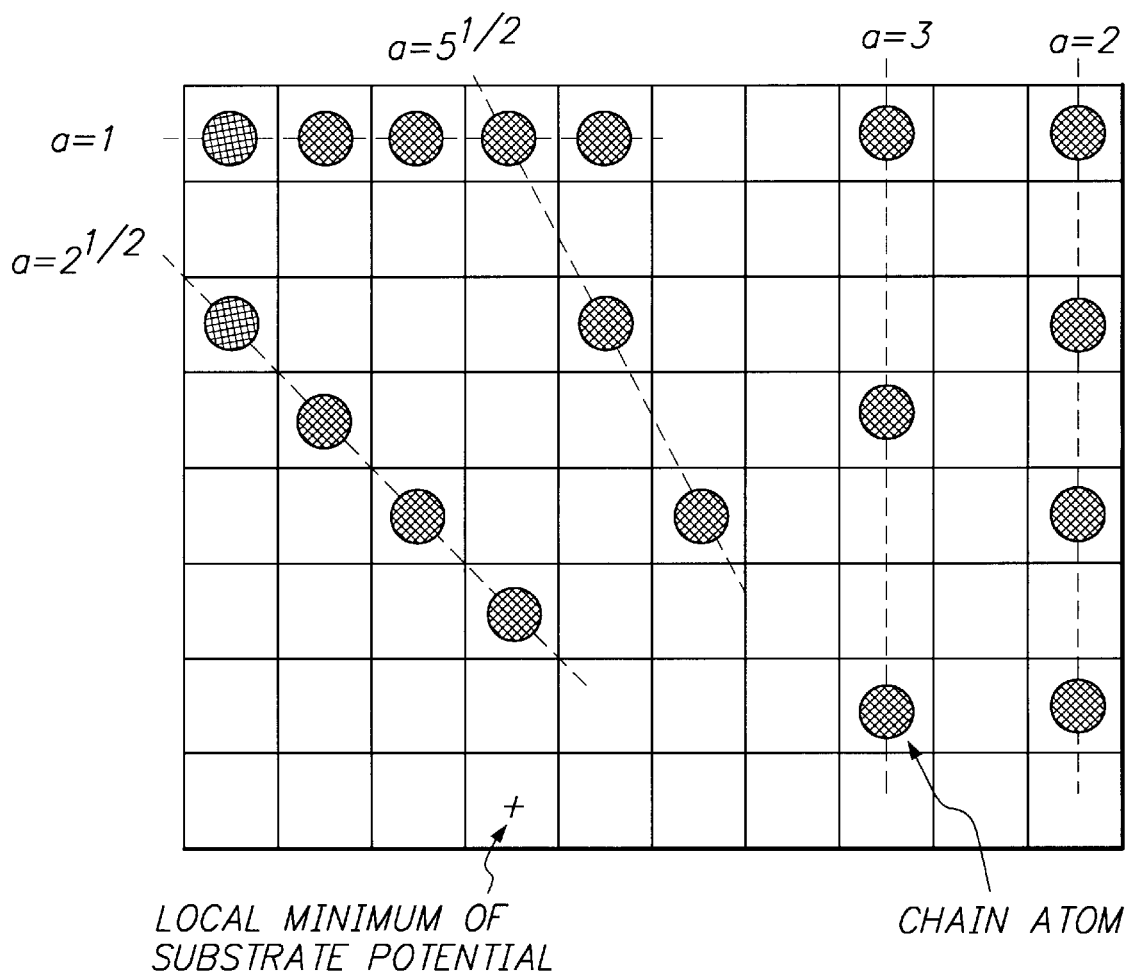
FIG. 5 shows atomic chain arranged in various directions with respect to square lattice potential.

Once the substrate with its surface crystal direction is determined, atoms can be arranged in various directions, which would give different lattice constant values. For example, if the substrate potential realizes a two-dimensional square lattice, it is possible to arrange atoms at integermultiples of basis vectors (with unity lattice period) such as (i) (1,0), (ii) (1,1), or (iii) (2,1), etc., where the lattice constant is (i) 1, (ii) √2, or (iii) √5, etc., respectively. It is also possible to arrange atoms at integer-multiples of basis vectors (2,0) or (3,0), where the lattice constant is 2 and 3 respectively. By this way, various discrete values of the lattice constant on the given substrate can be realized. Some schematic examples are shown in FIG. 5. Complications may arise if the surface reconstruction is relevant.

Characterization of metal and insulator states is non-trivial. Two conventional approaches can be used—an optical method and an electrical method. The former method is simpler since the state of present technology permits the construction of an atomic-scale spot light. In the optical measurement, metal and insulator phases are distinguished by the response to the input light. In the metal phase, a vertical (crystal momentum conserving) interband transition from the lower 3s-like band to the higher $3p_x$-like band is possible via a dipole interaction connecting two opposite-parity states for the light linearly polarized in the x-direction, as indicated by arrow 1 in FIG. 3(*a*). Also, a transition is possible from the lower 3s-like band to the discrete $3p_y$, $3p_z$ state for the light linearly polarized in the y- and z-directions, as indicated by arrow 2 in FIG. 3(*a*). A transition by arrow 3 between the upper band and the discrete $3p_y$, $3p_z$ state is quite weak. The momentum conservation law is not strictly enforced in a case involving a spatially localized state since momentum is uncertain for such state due to the Heisenberg principle, but the response is much weaker than interband transitions, because of small overlap of a spatially localized wave function and a Bloch wave function spreading over the entire chain. For these reasons, transition 1 has more dominant response than transition 2, although they can be distinguished by the polarization of input light. Transition 1 has discrete energy spectrum between 7.16 eV (0.173 μm) and 8.73 eV (0.142 μm) for a=5 Å, and transition 2 involving a spatially localized state has continuous photon energy spectrum between 6.77 eV (0.183 μm) and 7.57 eV(0.164 μm). Transition 3 has continuous spectrum with a lower threshold energy at 0 eV. A transition of the Fermi electrons to further higher bands that can be formed with 3d, 4s 4p, 4d, etc. functions would also be possible, but is not calculated here.

Figure 10A:
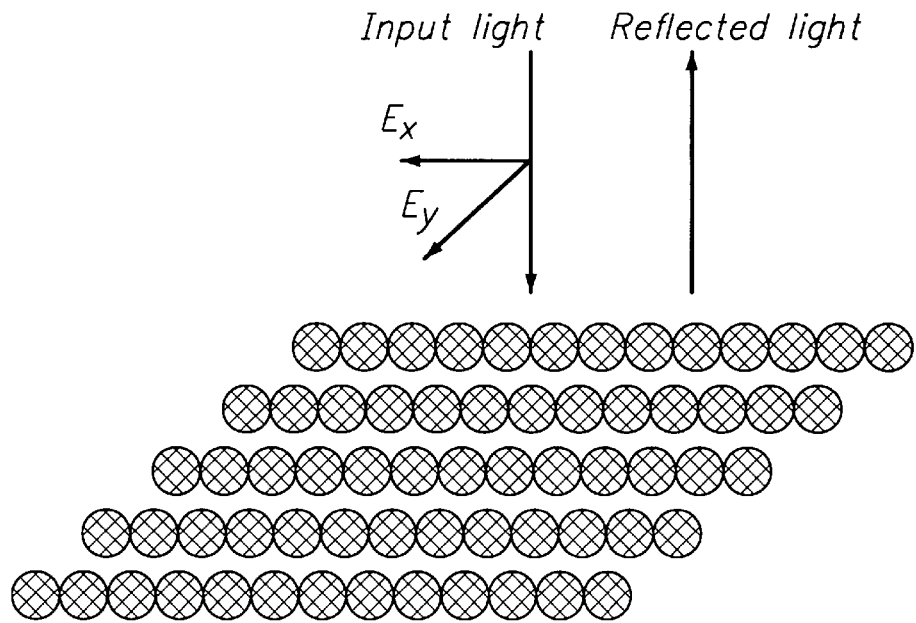
FIGS. 10(a)–(b) show alternate embodiments where a plurality of atomic chains are constructed to create an atomic chain circuit network.
Figure 10B:
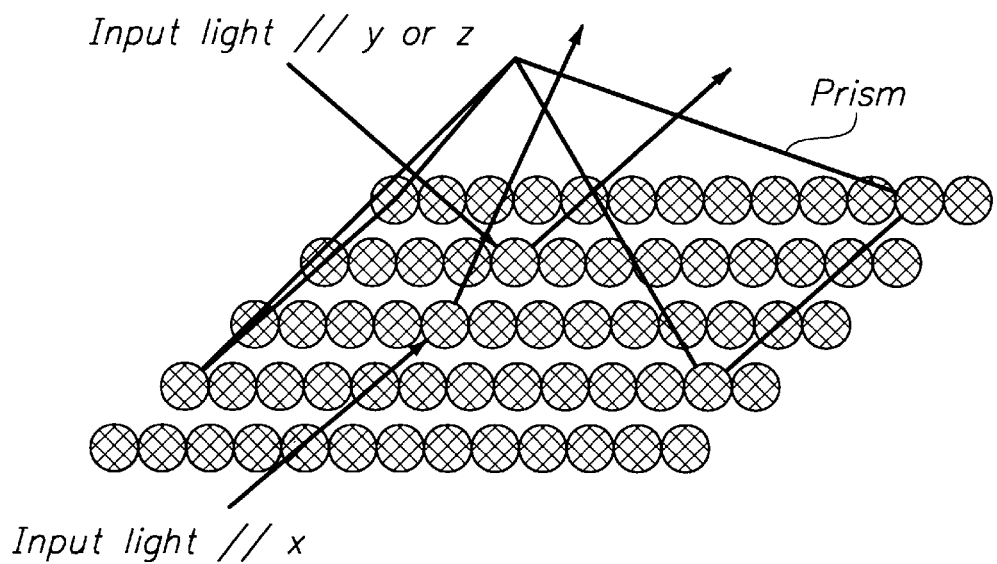

In the insulator phase, the peak energy of light in absorption or emission represents band gap energy since transitions are always between k=0 states or between k=+π/a states. When the light is linearly polarized in the x-direction, an optical process induces a vertical interband transition between the states on the curves of u'(a/2)=0 and g(a/2)=0, as indicated by arrow 1 in FIG. 3(*b*). When the light is polarized in the perpendicular direction to the chain (y- and z- directions), a transition indicated by arrow 2 between the discrete $3p_y$, $3p_z$ level and state F on the curve g(a/2)=0 is possible. The final state can be shifted to the state N direction, but is gradually mixed by the $3p_x$ state, and this weakens the response. A transition by arrow 3 between the discrete $3p_y$, $3p_z$ level and 3s-like state B is possible, and the response is again weakened as the initial state is shifted to the state M direction, due to the mixture of $3p_x$ state. Transition 1 is more dominant in response strength than transitions 2 and 3. For a=3 Å, transition 1 has a discrete energy spectrum between 6.51 eV (0.190 μm) and 17.6 eV (0.070 μm). Transition 2 has continuous spectrum with a lower threshold of 0.47 eV (2.6 μm) and transition 3 has continuous spectrum with an upper threshold of 13.4 eV (0.093 μm), as shown in FIG. 3(*b*). For a=2.8 Å, transition 1 has a lower energy threshold at 10.6 eV (0.117 μm), and transition 2 has continuous spectrum with a lower energy threshold at 3.53 eV (0.351 μm) and transition 3 has continuous spectrum with an upper energy threshold at 14.8 eV (0.084 μm). A small change in lattice constant leads to a large change in band gap and this property is advantageous in applications. In practice, the response from one atomic chain will be so weak for detection that it may be necessary to prepare an ensemble of parallel atomic chains and gather the reflected light as shown in FIG. 10(*a*). FIG. 10(*b*) also shows a prism that assists the reflection of incident light from the surface and where the // marks indicate the polarity of the light.

In the electrical method, one way to distinguish the metal and insulator phases is to measure the temperature dependence of conductance. In the metal phase, the temperature dependence of conductance is quite weak, if any, at most a power function of temperature due to the influence of phonon, since the number of carriers participating transport is independent of temperature. In the insulator phase, carriers available for transport have to be thermally excited from the lower filled states to an empty allowed band, and this process mainly determines the temperature dependence, which is a significant, exponential temperature dependence of conductance. This is a general guide line for the electrical characterization of metal and insulator phases, but the effect of conductance quantization in a small structure may influence the present context of atomic chain. Even in this case, there is practically no temperature dependence of conductance in the metal phase, and there is no change in this guideline.

A method to feed current to the atomic chain has to be established. There are two possible ways. One is more practical at this stage, to use a non-atomic scale battery and connection is made via mesoscopic systems. The other is possibility is to use an atomic-scale solar cell to generate voltage and feed current to the chain, which solves all the difficulties related to a battery connection. In order to create an atomic-scale solar cell, a spatially non-uniform structure has to be formed such as an atomic-scale Schottkey junction or an atomic-scale p-n junction in order to convert light energy to current.

Another important issue is how p-channel and n-channel atomic chains can be realized, and how doping can be done to control the carrier density. Doping can alter the carrier density, and can be used to form a gate. An analogy, thus, from the one-dimensional case to the threedimensional can be made, and three-dimensional structures can be produced according to this invention.

The minimal length for an atomic chain that can exhibit the predicted band structure in FIG. 1 has to be estimated. In an insufficiently long atomic chain, electron energy in an allowed energy region may not be continuous, and this places a lower limit for the preferable length of the atomic chain. The positions of band boundaries distinguishing allowed and forbidden energy regions like the curve g'(a/2)=0 etc. are quite insensitive to the number of atoms contained in the chain as is discussed by Shockley. This is because they are the curves corresponding to the wave functions with the polarity of either +1, +1, +1, +1, . . . or +1, −1, +1, −1, . . . from cell to cell as shown in FIGS. 3(*a*)–(*c*), where the period in wave function is at most a or 2a, and e.g. several atoms may be enough to realize these states. There are 2N discrete states per chain, with spin degree of freedom, in one of the spa-hybrid allowed bands, where N is the number of atoms. Thus, for successful observation of FIG. 1, characteristic energy spread of electrons should be much larger than allowed band width divided by 2N, or else energy spectrum is not practically continuous and metal properties may not be observed. As a rough estimation, an atomic chain with 100 atoms will have continuous energy spectrum with resolution of ~5 meV for band width of ~1 eV. Generally, the width of the spx-hybrid band is larger for smaller lattice constant, which means more atoms have to be used for smaller lattice constant to achieve the same resolution of continuous energy.

This insufficiently long chain problem is also related to the Shockley's surface state. If the chain length is finite, there are localized states at both ends of the chain, since the translational symmetry of the potential is suddenly broken at the edges, and the number of such states is four in total with spin degree of freedom. Such states will appear in the forbidden regions marked by * in FIG. 1. If the chain is long enough, the effect of such states is small (~2/N) and is safely neglected. If not, these four states have to be counted. For example, the optical excitation from these states to the allowed energy bands may be possible. However, as discussed above, the continuous energy condition places stricter requirement than this, and the Shockley surface state is not a problem as long as the observation of the predicted band in FIG. 1 is concerned.

As a last comment on the practical placement of atoms, it must be noted that thermal vibration will affect the stability of the atomic chain structure. Because of the thermal vibration of chain and substrate atoms, the chain atoms may move from their original positions to other neighboring positions by overcoming the potential barrier of the substrate potential. Thus, the environment may need to be cooled so that the thermal vibration energy of atoms will be minimized to realize the predicted band structure. In other words, the substrate should provide a high enough barrier to support the atomic chain structure.

EXAMPLE OF VARIOUS ATOMIC CHAIN NETWORKS

Figure 6:
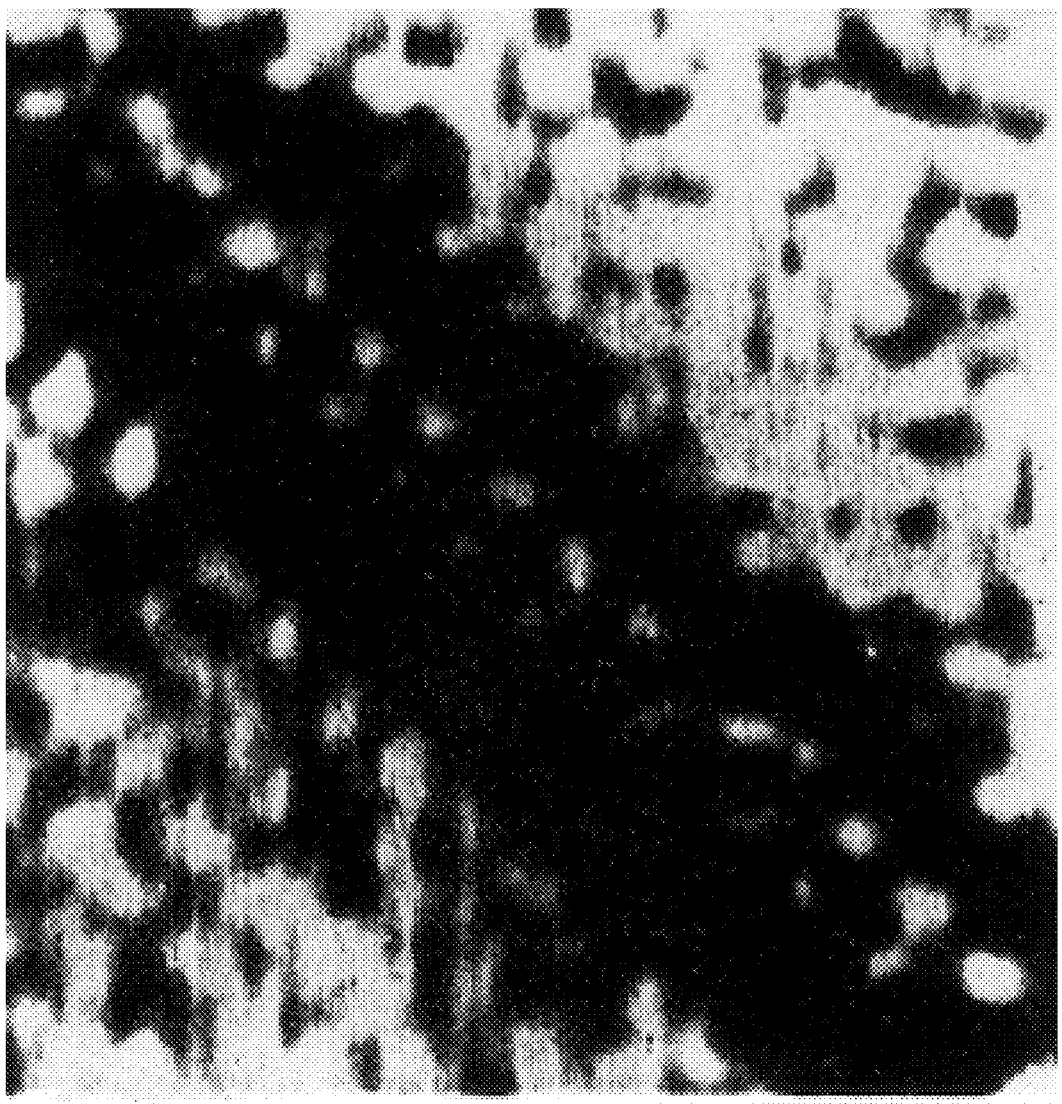
FIG. 6 is a SEM photograph of an atomic chain constructed on a Si (111) lattice substrate according to the present invention.

FIG. 6 is a photograph of a Si atomic chain fabricated on as Si substrate, where the chain was defined by extracting Si atoms from the (111) Si substrate one by one along a line with a scanning tunneling microscope in the ultrahigh vacuum environment (the picture after Aono Atomic Craft Project, Research Development Corporation of Japan). In this preliminary example, the absence of atoms defined an atomic chain, unlike the following discussions where the presence of atoms forms the chain. It is emphasized, however, that this result demonstrates the ability to fabricate such atomic chain structures by manipulating atoms one by one. This leads to the concept of one-dimensional array of atoms, or atomic chain, where chain atoms couple with each other but are isolated from the substrate so that electron motion is restricted only in the chain. The substrate provides a potential by which an atomic chain can be formed. With changing a lattice constant, the band structure and the Fermi energy can be controllable. An atomic chain of Si, the most common material in the semiconductor technology, is discussed.

FIGS. 7(a)–(e) show schematically an atomic chain of such as Si atoms fabricated on an insulator substrate such as sapphire, where the lattice constant is determined by the crystal direction of the substrate surface, together with what kind of chain atoms and substrate materials are used. Generally, the metal state is realized for a large lattice constant and the insulator state is realized for a small lattice constant as shown in FIG. 2.

Figure 7A:
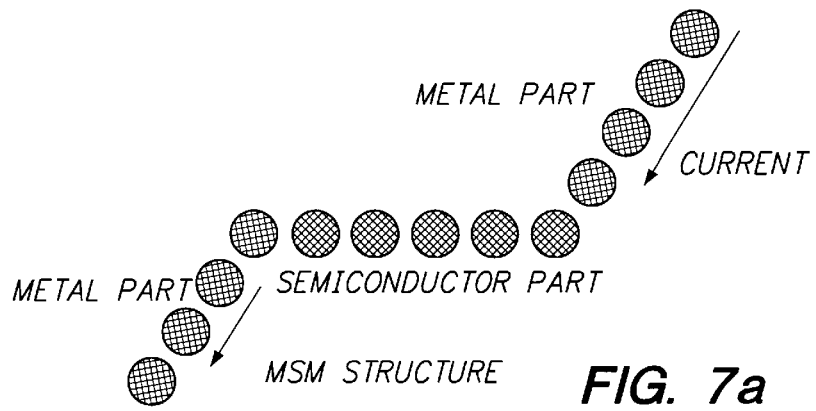
FIGS. 7(a)–(e) show various networks formed by atomic chains constructed according to the present invention.
Figure 7B:
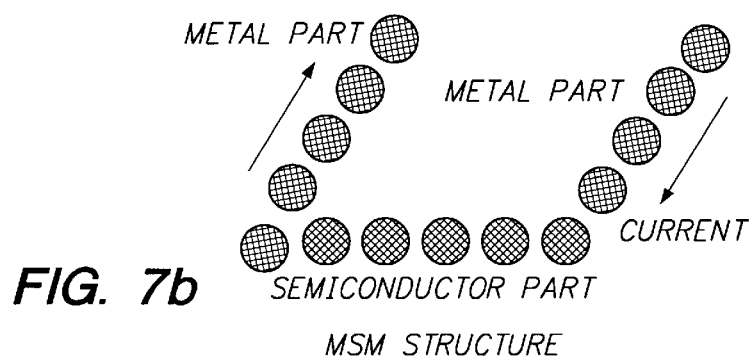
Figure 7C:
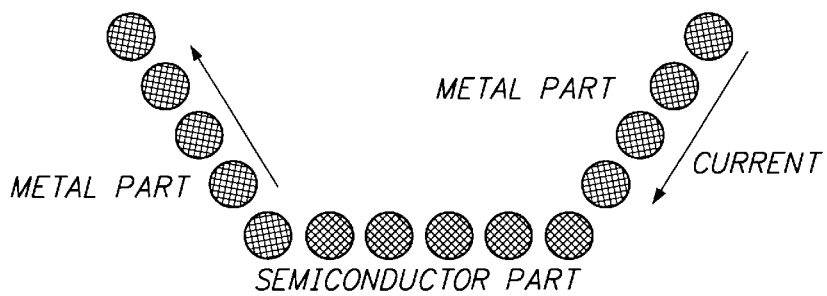
Figure 7D:
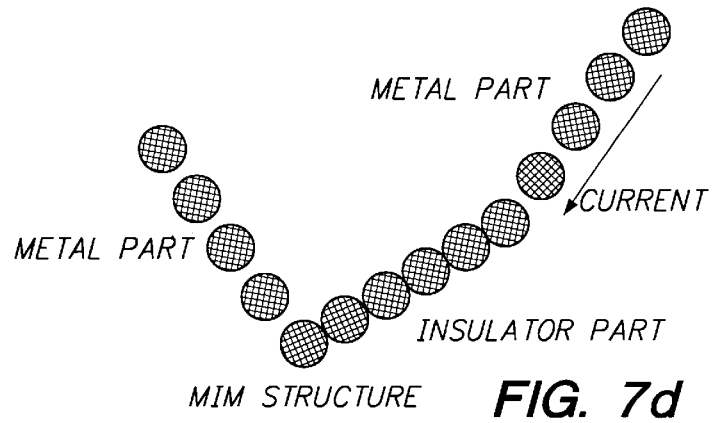

Since the substrate potential has a different potential period for different crystal directions with respect to the substrate surface, the direction of the atomic chain uniquely determines the electrical state of the chain, which can be metal, semiconductor, or insulator. It is then possible to create a circuit network by connecting atomic chains in various directions on the substrate surface. FIG. 7(a) shows a structure where metal atomic chains and a semiconductor/insulator atomic chain are connected in series as a one-hand drawing, and FIG. 7(b) another possible structure where a pair of metal chains are placed in parallel at the same side of the semiconductor chain, and both ends of the semiconductor chain are connected at the both ends of metal chains. The width of the semiconductor can be changed by changing the separation of the two parallel atomic chain in both structures. FIG. 7(c) shows a further possible metal-semiconductor-metal (MSM) structure and FIG. 7(d) a metal-insulator-metal (MIM) structure by utilizing the directional dependence of the substrate potential period. It is often the case that the direction is not unique to obtain a certain state, which can be metal, semiconductor or insulator. Then such multiple directions are used to form a structure as shown in FIG. 7(d). The Schottkey junction can be created similarly. The same policy can be applied to a p-n junction. These junctions are used electrically or optically, the latter of which will be discussed in connection with solar cells and light emitting diodes. Also, while the current-voltage (IV) relationships for these junctions is not yet fully characterized, a nonlinear relationship is expected, as in analogous to the macroscopic case.

Figure 7E:
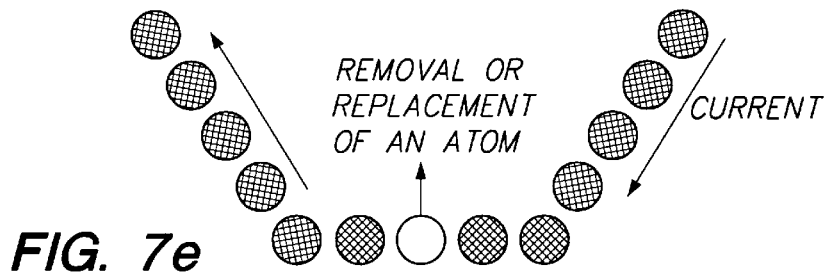

FIG. 7(e) shows an atomic switch or a gate by removing an atom from the atomic chain. The translational symmetry of the potential along the chain is broken here at the defect. This defect may cause the accumulation of carriers (act as a potential well) or the depletion of carriers, depending on the length of the atomic chain and the width of the defect. If the chain is long enough in both sides of the defect so that the band structure is well-defined and eigen-energies are continuous, and the spatial gap of the defect is wide, then there will be a localized state in the atomic chain at the both ends of the defect as predicted as a surface state in a paper by W. Shockley, Physical Review, 56, 317, (1939). Oppositely, if the chain before being removed an atom is not long enough and the gap is narrow, the defect will act as a potential barrier and cause the depletion of carriers. We may replace an atom with a different kind of atom, instead of removing it, as in FIG. 7(e), and can expect similar accumulation or depletion effects.

Figure 8A:
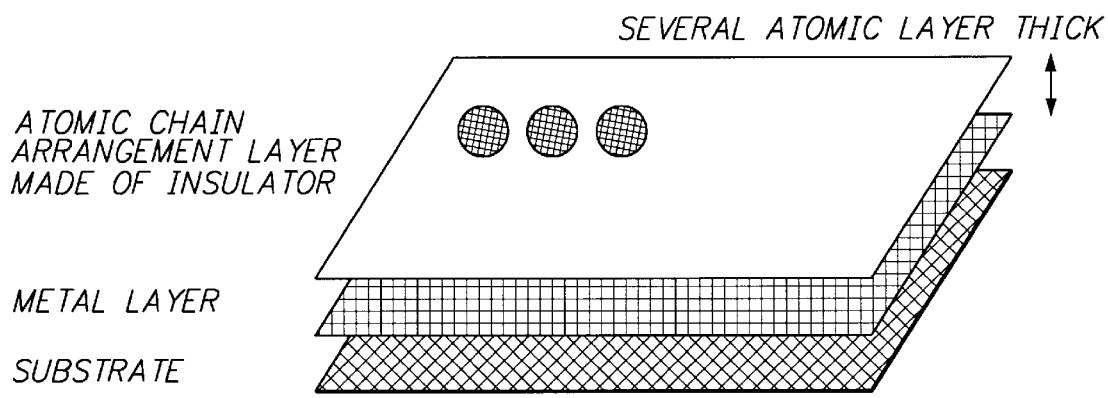
FIGS. 8(a)–(d) show various network configurations formed by various substrates and atomic chains constructed according to the present invention.
Figure 8B:
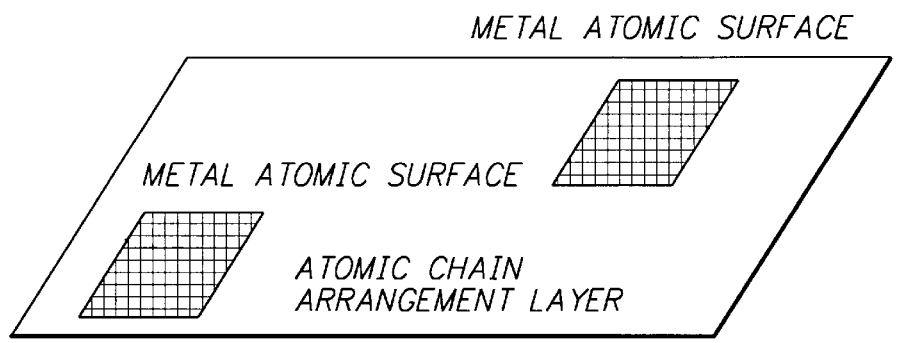

Ground is important in practical circuit applications and is fabricated by growing a macroscopic metal layer at the back surface of the substrate traditionally. However, since the substrate is much thicker compared with the atomic-scale and it is not trivial to connect the atomic chain with the ground at the back surface, one way to accomplish create the ground layer is to construct a metal layer on the top of the substrate surface, and then grow an insulator layer with the thickness of several atoms, as indicated in FIG. 8(a). In this case, it is expected that a carrier in the atomic chain will induce an image charge in the metal across the insulator layer, and they are bounded through the Coulomb interaction. Because of this, the transport properties of the carrier along the atomic chain is modified. Or, another way to obtain ground is to create a two-dimensional array of atoms with a lattice constant large enough to realize a metal state, which is called as a metal atomic surface here, and use it as ground as shown in FIG. 8(b).

Figure 8C:
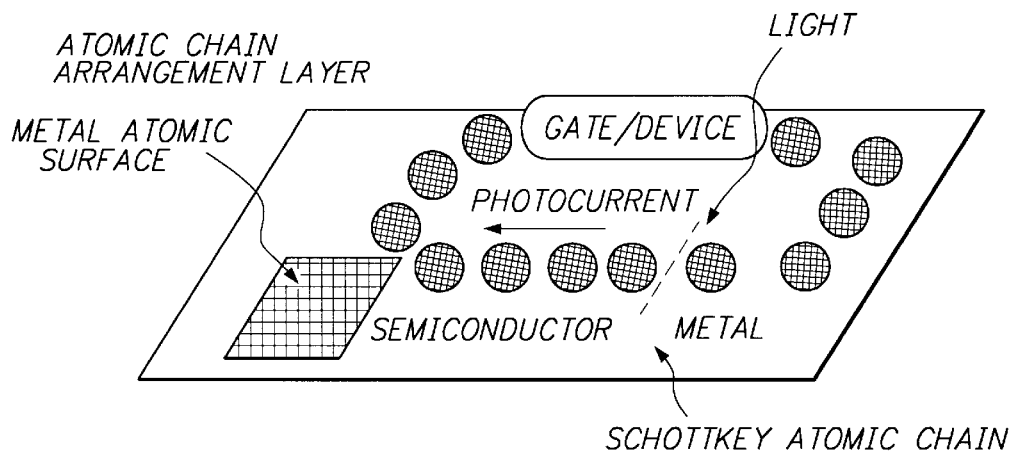

It is necessary to establish a method to apply voltage to the circuit elements. An atomic-scale solar cell is made of a Schottkey junction with a metal chain and a p-semiconductor chain if the p-semiconductor atomic chain is successfully prepared, where light is applied at the junction as shown in FIG. 8(c). The adoption of such spatially nonuniform structure is beneficial in order to maintain a steady current flow, just like the case of macroscopic solar cells. This atomic-scale solar cell is ideal for circuit network with atomic chains since (1) the atomic chain has a direct band gap due to the dimensionality of the system and there would be an efficient interaction with light, and (2) the connection of the battery (the present atomic-scale solar cell) to the atomic chain devices does not cause any trouble due to their same scale. The solar cell is also possible by using a p-n junction. The Schottkey junction can also serve as a light emitting diode under the forward bias condition, in analogy with the macroscopic case, where the electron-hole radiative recombination process is realized. Because of the dimensionality of the system, the band gap is direct and the efficiency for light transformation of electric energy is expected to be high. The light emission is again possible with p-n junction.

Figure 8D:
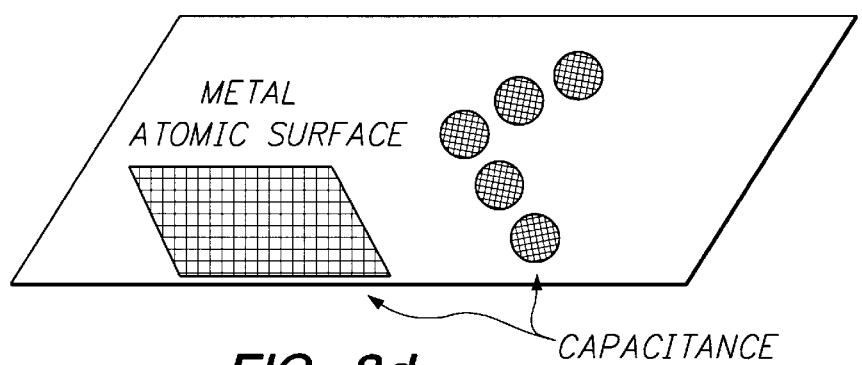

FIG. 8(d) shows a method to obtain a floating capacitance, where a metal atomic surface is created close to a metal atomic chain. The capacitance value is determined by the geometry and the constituent atoms. Such capacitance can be used, for example, to create a device with the Coulomb blockade effect where an extremely small capacitance value (the charged capacitance energy is much larger than the thermal energy) is necessary.

Figure 9:
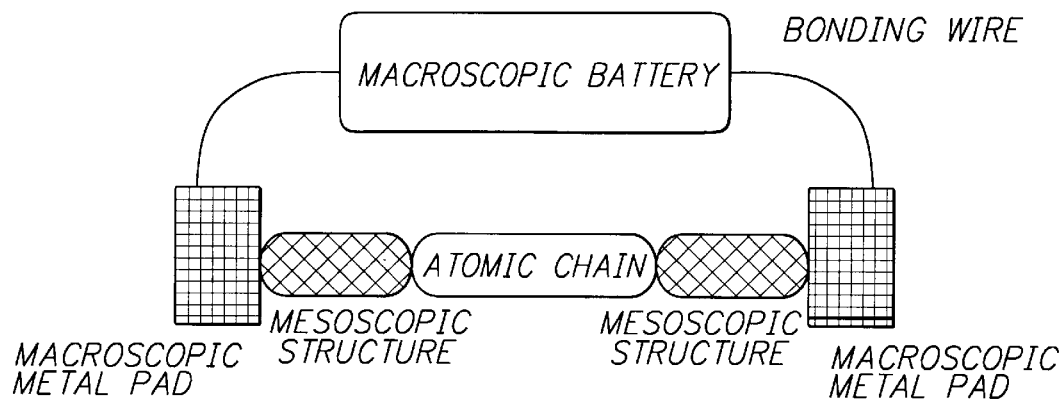
FIG. 9 shows an atomic chain network coupled to a mesoscopic structure and macroscopic structure to interface with a battery.

FIG. 9 shows an example to connect an atomic chain with a macroscopic system such as an external battery, which is complex when the battery is macroscopic and the atomic chain is microscopic. The atomic chain is connected to the battery pads via mesoscopic systems. Once the chain is connected to the macroscopic battery pads, it is easy to connect to the battery with bonding wire.

If the same chain and substrate structure is repeated more than twice in the vertical direction, we can save area and such configuration is advantageous for future integration.

Having disclosed a preferred embodiment and the best mode, modifications and variations may be made to the disclosed embodiments while remaining within the scope of the present invention as defined by the claims.

What is claimed is:

1. A method of making an atomic chain circuit on a platform having periodic potentials comprising the steps of:
    placing atoms at predetermined locations according to the periodic potentials on the platform to form chains of atoms where each chain behaves as one of a conductor, semiconductor and insulator based at least in part on an atomic spacing between the atoms of each chain; and
    wherein said forming step is performed with sapphire.

2. A method of making an atomic chain circuit on a platform having periodic potentials comprising the steps of:
    placing atoms at predetermined locations according to the periodic potentials on the platform to form chains of atoms where each chain behaves as one of a conductor, semiconductor and insulator based at least in part on an atomic spacing between the atoms of each chain;
    wherein said placing step is performmed with silicon atoms; and
    wherein said placing step is performed by spacing the predetermined locations at greater than approximately 3.04 Å for a conductor, spacing the predetermined locations at approximately 3.04 Å for a semiconductor, and spacing the predetermined locations at less than approximately 3.04 Å for an insulator.

3. A method of making an atomic chain circuit comprising the steps of:
    forming a substrate with a plurality of lattice oriented atoms to create a substantially planar surface having a lattice arrangement and periodic potentials;
    terminating any unsatisfied chemical bonds from the substrate by placing atoms at the site of any unsatisfied chemical bonds to terminate the unsatisfied chemical bonds and insulate the surface to form an insulated lattice platform;
    placing atoms at predetermined locations according to the periodic potentials on the platform to form chains of atoms where each chain behaves as one of a conductor, semiconductor and insulator based at least in part on an atomic spacing between the atoms of each chain; and
    wherein said substrate is sapphire.

4. A method of making an atomic chain circuit comprising the steps of:
    forming a substrate with a plurality of lattice oriented atoms to create a substantially planar surface having a lattice arrangement and periodic potentials;
    terminating any unsatisfied chemical bonds from the substrate by placing atoms at the site of any unsatisfied chemical bonds to terminate the unsatisfied chemical bonds and insilate the surface to form an insulated lattice platform;
    placing atoms at predetermined locations according to the periodic potentials on the platform to form chains of atoms where each chain behaves as one of a conductor, semiconductor and insulator based at least in part on an atomic spacing between the atoms of each chain;
    wherein said placing step is performed with silicon atoms; and
    said placing step is performed by spacing the predetermined locations at greater than approximately 3.04 Å for a conductor, spacing the predetermined locations at approximately 3.04 Å for a semiconductor, and spacing the predetermined locations at less than approximately 3.04 Å for an insulator.

5. A method of making an atomic chain circuit on a platform having predetermined crystallographic directions comprising the steps of:
    placing atoms at predetermined locations according to the crystallographic directions on the platform to form chains of atoms where each chain behaves as one of a conductor, semiconductor and insulator based at least in part on an atomic spacing between the atoms of each chain.

6. The method of claim 5, wherein:
    said placing step is performed by placing each atom at a predetermined location representing a relative potential minimum within the boundary of the lattice structure.

7. The method of claim 5, wherein the platform is an insulated lattice made by a method including the steps of:
    forming a substrate with a plurality of lattice oriented atoms to create a substantially planar surface having a lattice arrangement; and
    terminating any unsatisfied chemical bonds from the substrate along the substantially planar surface by placing atoms at the site of the unsatisfied chemical bonds to terminate the unsatisfied chemical bonds and insulate the surface to form the insulated lattice platform.

8. The method of claim 7, wherein:
    said placing step is performed by placing each atom at a predetermined location representing a relative potential minimum within the boundary of the lattice structure.

9. The method of claim 5, wherein:

said placing step is performed with group IVA element atoms.

10. The method of claim 5, wherein:

said placing step is performed with silicon atoms.

11. The method of claim 7, wherein:

said forming step is performed with sapphire.

12. The method of claim 5, wherein:

said placing step is performed by spacing the predetermined locations at greater than approximately 3.04 Å for a conductor, spacing the predetermined locations at approximately 3.04 Å for a semiconductor, and spacing the predetermined locations at less than approximately 3.04 Å for an insulator.

13. A method of making an atomic chain on a platform having predetermined crystallographic directions comprising the steps of:

placing atoms at predetermined locations according to the crystallographic directions on the platform to form a chain of atoms that behaves as one of a conductor, semiconductor and insulator based at least in part on an atomic spacing between the atoms of the chain.

14. An atomic chain circuit made according to the method of claim 2.

15. An atomic chain made according to the method of claim 13.

* * * * *